United States Patent

Patel et al.

[11] Patent Number: 6,104,442
[45] Date of Patent: Aug. 15, 2000

[54] RADIO RECEIVER FOR RECEIVING BOTH VSB AND QAM DIGITAL HDTV SIGNALS

[75] Inventors: Chandrakant Bhailalbhai Patel, Hopewell; Allen LeRoy Limberg, Ringoes, both of N.J.

[73] Assignee: Samsung Electronics Co., Ltd., Kyungki-do, Rep. of Korea

[21] Appl. No.: 08/266,753

[22] Filed: Jun. 28, 1994

[51] Int. Cl.[7] .................................................. H04N 5/44
[52] U.S. Cl. .......................... 348/725; 375/261; 348/726
[58] Field of Search .................................. 348/426, 558, 348/726, 725, 731; 375/261, 321; H04N 5/44

[56] References Cited

U.S. PATENT DOCUMENTS

| | | | |
|---|---|---|---|
| 4,730,345 | 3/1988 | Reeve, III | 375/321 |
| 4,878,228 | 10/1989 | Takahashi | 375/261 |
| 5,087,975 | 2/1992 | Citta et al. | 348/726 |
| 5,264,937 | 11/1993 | Christopher | 348/725 |
| 5,283,653 | 2/1994 | Citta | 348/725 |
| 5,315,617 | 5/1994 | Guida et al. | 375/261 |

*Primary Examiner*—Victor R. Kostak
*Attorney, Agent, or Firm*—Sughrue, Mion, Zinn, Macpeak & Seas

[57] ABSTRACT

A radio receiver for receiving a selected digital HDTV signal, irrespective of whether it is a complex-amplitude-modulation (QAM) or a vestigial sideband (VSB) signal, using the same tuner. The tuner supplies a final IF signal in a 6 MHz frequency band, the lowest frequency of which is not appreciably more than 2.38 MHz. The final IF signal is digitized for synchrodyning to baseband, with the 2.375 MHz difference between the carrier frequencies of QAM and VSB signals being taken into account in the digital synchrodyning circuitry. The carrier frequencies of the QAM and VSB final IF signals are regulated to be submultiples of symbol frequency by applying automatic frequency and phase control signals developed in the digital circuitry to a local oscillator of the tuner. The presence of the pilot carrier accompanying a selected VSB HDTV signal is detected for automatically switching the radio receiver for operation in a VSB signal reception mode. The absence of pilot carrier accompanying a selected QAM HDTV signal is detected for automatically switching the radio receiver for operation in a QAM signal reception mode.

22 Claims, 12 Drawing Sheets

| SUBHARMONIC OF 43.04 MHz | SUBHARMONIC OF 21.52 MHz | FREQUENCY IN MHz | SUBHARMONIC -2.375 MHz |
|---|---|---|---|
| 8 | 4 | 5.380 | 3.005 |
| 9 | | 4.782 | 2.407 |
| 10 | 5 | 4.304 | 1.929 |
| 11 | | 3.913 | 1.538 |
| 12 | 6 | 3.587 | 1.212 |
| 13 | | 3.311 | 0.936 |
| 14 | 7 | 3.074 | 0.699 |
| 15 | | 2.869 | 0.494 |
| 16 | 8 | 2.690 | 0.315 |
| 17 | | 2.532 | 0.157 |
| 18 | 9 | 2.391 | 0.015 |
| 19 | | 2.265 | −0.110 |
| 20 | 10 | 2.152 | |
| 21 | | 2.050 | |
| 22 | 11 | 1.956 | |
| 23 | | 1.871 | |
| 24 | 12 | 1.793 | |
| 25 | | 1.722 | |
| 26 | 13 | 1.655 | |
| 27 | | 1.594 | |
| 28 | 14 | 1.537 | |
| 29 | | 1.484 | |
| 30 | 15 | 1.435 | |
| 31 | | 1.388 | |
| 32 | 16 | 1.345 | |
| 33 | | 1.304 | |
| 34 | 17 | 1.266 | |
| 35 | | 1.230 | |
| 36 | 18 | 1.196 | |
| 37 | | 1.163 | |

FIG. 4

RADIO RECEIVER FOR RECEIVING BOTH VSB AND QAM DIGITAL HDTV SIGNALS

The invention relates to radio receivers having the capability of receiving digital high-definition television (HDTV) signals, no matter whether they are transmitted using quadrature amplitude modulation (QAM) of the principal carrier wave or they are transmitted using vestigial sideband (VSB) amplitude modulation of the principal carrier wave.

BACKGROUND OF THE INVENTION

Vestigial sideband (VSB) signals that are used in certain transmissions of HDTV signal have their natural carrier wave, which would vary in amplitude depending on the percentage of modulation, replaced by a pilot carrier wave of fixed amplitude, which amplitude corresponds to a prescribed percentage of modulation. This percentage modulation can be made the same as that associated with the smallest change in symbol code level. Such VSB signals using 8-level symbol coding will be used in over-the-air broadcasting within the United States, for example, and can be used in over-the-air narrowcasting systems or in cable-casting systems. However, certain cable-casting is likely to be done using suppressed-carrier quadrature amplitude modulation (QAM) signals instead, rather than VSB signals. This presents television receiver designers with the challenge of designing receivers that are capable of receiving either type of transmission and of automatically selecting suitable receiving apparatus for the type of transmission currently being received.

A television receiver designer of ordinary skill in the art will readily observe that processing after symbol decoding is similar in receivers for the VSB HDTV signals and in receivers for the QAM HDTV signals, since the data format supplied for symbol encoding is the same in transmitters for the VSB HDTV signals and in transmitters for the QAM HDTV signals. The data recovered by symbol decoding are supplied as input signal to a data de-interleaver, and the de-interleaved data are supplied to a Reed-Solomon decoder. Error-corrected data are supplied to a data de-randomizer which regenerates packets of data for a packet decoder. Selected packets are used to reproduce the audio portions of the HDTV program, and other selected packets are used to reproduce the video portions of the HDTV program. A television receiver designer of ordinary skill in the art will readily observe also that the tuners are quite similar in receivers for the VSB HDTV signals and in receivers for the QAM HDTV signals. The differences in the receivers reside in the synchrodyning procedures used to translate the final IF signal to baseband and in the symbol decoding procedures. A television receiver designer of ordinary skill in the art will readily deduce that a receiver that is capable of receiving either VSB or QAM HDTV signals is more economical in design if it does not duplicate the similar tuner circuitry prior to synchrodyning to baseband and the similar receiver elements used after the symbol decoding circuitry. The challenge is in optimally constructing the circuitry for synchrodyning to baseband and for symbol decoding to accommodate both HDTV transmission standards and in arranging for the automatic selection of the appropriate mode of reception for the HDTV transmission currently being received.

Digital HDTV signal radio receivers are known of a type that uses double-conversion in the tuner followed by synchronous detection. A frequency synthesizer generates first local oscillations that are heterodyned with the received television signals to generate first intermediate frequencies (e.g., with 920 MHz carrier). A passive LC bandpass filter selects these first intermediate frequencies from their image frequencies for amplification by a first intermediate-frequency amplifier, and the amplified first intermediate frequencies are filtered by a first surface-acoustic-wave (SAW) filter that rejects adjacent channel responses. The first intermediate frequencies are heterodyned with second local oscillations to generate second intermediate frequencies (e.g., with 41 MHz carrier), and a second SAW filter selects these second intermediate frequencies from their images and from remnant adjacent channel responses for amplification by a second intermediate-frequency amplifier. The response of the second intermediate-frequency amplifier is supplied to a third mixer to be synchrodyned to baseband with third local oscillations of fixed frequency. The third local oscillations of fixed frequency can be supplied in 0° - and 90° -phasing, thereby implementing separate in-phase and quadrature-phase synchronous detection procedures during synchrodyning. Synchrodyning is the procedure of multiplicatively mixing a modulated signal with a wave having a fundamental frequency the same as the carrier of the modulated signal, being locked in frequency and phase thereto, and lowpass filtering the result of the multiplicative mixing to recover the modulating signal at baseband, baseband extending from zero frequency to the highest frequency in the modulating signal. Separately digitizing in-phase and quadrature-phase synchronous detection results generated in the analog regime presents problems with regard to the synchronous detection results satisfactorily tracking each other after digitizing; quantization noise introduces pronounced phase errors in the complex signal considered as a phasor. These problems can be avoided in HDTV signal radio receivers of types performing the in-phase and quadrature-phase synchronous detection procedures in the digital regime. By way of example, the response of the second intermediate-frequency amplifier is digitized at twice the Nyquist rate of the symbol coding. The successive samples are considered to be consecutively numbered in order of their occurrence; and odd samples and even samples are separated from each other to generate respective ones of the in-phase (or real) and quadrature-phase (or imaginary) synchronous detection results. Quadrature-phase (or imaginary) synchronous detection takes place after Hilbert transformation of one set of samples using appropriate finite-impulse-response (FIR) digital filtering, and in-phase (or real) synchronous detection of the other set of samples is done after delaying them for a time equal to the latency time of the Hilbert-transformation filter. The methods of locking the frequency and phase of synchronous detection and the methods of locking the frequency and phase of symbol decoding differ in the VSB and QAM HDTV receivers.

The inventors point out that these types of known digital HDTV signal radio receiver present some problem in the design of the tuner portion of the receiver because the respective carrier frequencies of VSB HDTV signals and of QAM HDTV signals are not the same as each other. The carrier frequency of a QAM HDTV signal is at mid-channel of the transmission frequencies. The carrier frequency of a VSB HDTV signal is 2.375 MHz below mid-channel frequency. Accordingly, the third local oscillations of fixed frequency, which are used for synchrodyning to baseband, must be of different frequency when synchrodyning VSB HDTV signals to baseband than when synchrodyning QAM HDTV signals to baseband. The 2.375 MHz difference in frequency is larger than that which is readily accommodated by applying automatic frequency and phase control to the third local oscillator. A third oscillator that can switchably select between two frequency-stabilizing crystals is a practical necessity. In such an arrangement, of course, alterations in the tuner circuitry are involved with arranging for the automatic selection of the appropriate mode of reception for the HDTV transmission currently being received. The radio-frequency switching that must be done reduces the reliability of the tuner. The RF switching and the additional frequency-stabilizing crystal for the third oscillator increase the cost of the tuner appreciably.

Radio receivers for receiving VSB HDTV signals, in which receiver the third mixer output signal is a final intermediate-frequency signal somewhere in the 1–8 MHz frequency range rather than at baseband, are described by the inventors in the U.S. patent applications listed below, incorporated by reference herein, and commonly assigned herewith:

Ser. No. 08/237,896 filed May 4, 1994 and entitled DIGITAL VSB DETECTOR WITH BANDPASS PHASE TRACKER, AS FOR INCLUSION IN AN HDTV RECEIVER;

Ser. No. 08/243,480 filed May 19, 1994 and entitled DIGITAL VSB DETECTOR WITH BANDPASS PHASE TRACKER USING RADER FILTERS, AS FOR USE IN AN HDTV RECEIVER; and Ser. No. 08/247,753 filed May 23, 1994 and entitled DIGITAL VSB DETECTOR WITH FINAL I-F CARRIER AT SUBMULTIPLE OF SYMBOL RATE, AS FOR HDTV RECEIVER.

The final IF signal is digitized and the synchrodyne procedures are carried out in the digital regime. Radio receivers that receive QAM signals, convert them to a final IF signal just above baseband, and synchrodyne the final IF signal in the digital regime are known; and such receivers can be adapted for receiving HDTV signals, it is believed to be evident at this time to a television receiver designer of ordinary skill in the art. In radio receivers that are to have the capability of receiving digital HDTV signals no matter whether they are transmitted using VSB or QAM, the inventors point out, conversion of the signals to final IF signals just above baseband permits the frequency of the oscillations of the third local oscillator to remain the same no matter whether VSB or QAM transmissions are being received. The differences in carrier frequency location within the channel can be accommodated in the synchrodyning procedures carried out in the digital regime.

SUMMARY OF THE INVENTION

The invention is embodied in a radio receiver for receiving a selected one of digital HDTV signals each including symbol codes descriptive of digital signals, irrespective of whether said selected HDTV signal is a quadrature-amplitude-modulation (QAM) signal or is a vestigial sideband (VSB) signal including a pilot carrier having an amplitude related to signal levels in said symbol codes thereof. A tuner within the receiver includes elements for selecting one of channels at different locations in a frequency band used for transmitting HDTV signals, a succession of mixers for performing a plural conversion of signal received in the selected channel to a final intermediate-frequency (IF) signal, a respective frequency-selective amplifier between each earlier one of the mixers in that succession and each next one of said mixers in that succession, and a respective local oscillator for supplying oscillations to each of the mixers. Each of these local oscillators supplies respective oscillations of substantially the same frequency irrespective of whether the selected HDTV signal is a QAM signal or is a VSB signal. The final IF signal is digitized, and the differences in signal processing depending on whether the selected HDTV signal is a QAM signal or is a VSB signal are accommodated principally in digital circuitry including QAM synchrodyning circuitry and VSB synchrodyning circuitry. The QAM synchrodyning circuitry generates real and imaginary sample streams of interleaved QAM symbol code, by synchrodyning the digitized final IF signal to baseband providing it is a QAM signal and otherwise processing the digitized final IF signal as if it were a QAM signal to be synchrodyned to baseband. The VSB synchrodyning circuitry generates a real sample stream of interleaved VSB symbol code, by synchrodyning the digitized final IF signal to baseband providing it is a VSB signal and otherwise processing the digitized final IF signal as if it were a VSB signal to be synchrodyned to baseband.

In preferred embodiments of the invention, a detector is provided for determining whether the final IF signal is a QAM signal or a VSB signal to generate a control signal, which is in a first condition when the final IF signal is a QAM signal and is in a second condition when the final IF signal is a VSB signal. Responsive to the control signal being in its first condition, the radio receiver is automatically switched to operate in a QAM signal reception mode; and responsive to the control signal being in its second condition, the radio receiver is automatically switched to operate in a VSB signal reception mode. This detector is one which senses the presence of a pilot carrier accompanying a digital HDTV signal of VSB type in certain preferred embodiments of the invention.

BRIEF DESCRIPTION OF THE DRAWINGS

FIG. 4 is a table of subharmonics of the 21.52 MHz sampling frequency and of 43.04 MHz, the second harmonic of the 21.52 MHz sampling frequency.

In the block schematic diagrams, clock or control signal connections are shown in dashed line, where it is desired to distinguish them from connections for the signals being controlled. To avoid overcomplexity in the block schematic diagrams, some shimming delays necessary in the digital circuitry are omitted, where a need for such shimming delay is normally taken into account by a circuit or system designer.

DETAILED DESCRIPTION OF THE PREFERRED EMBODIMENTS

Figure 1:
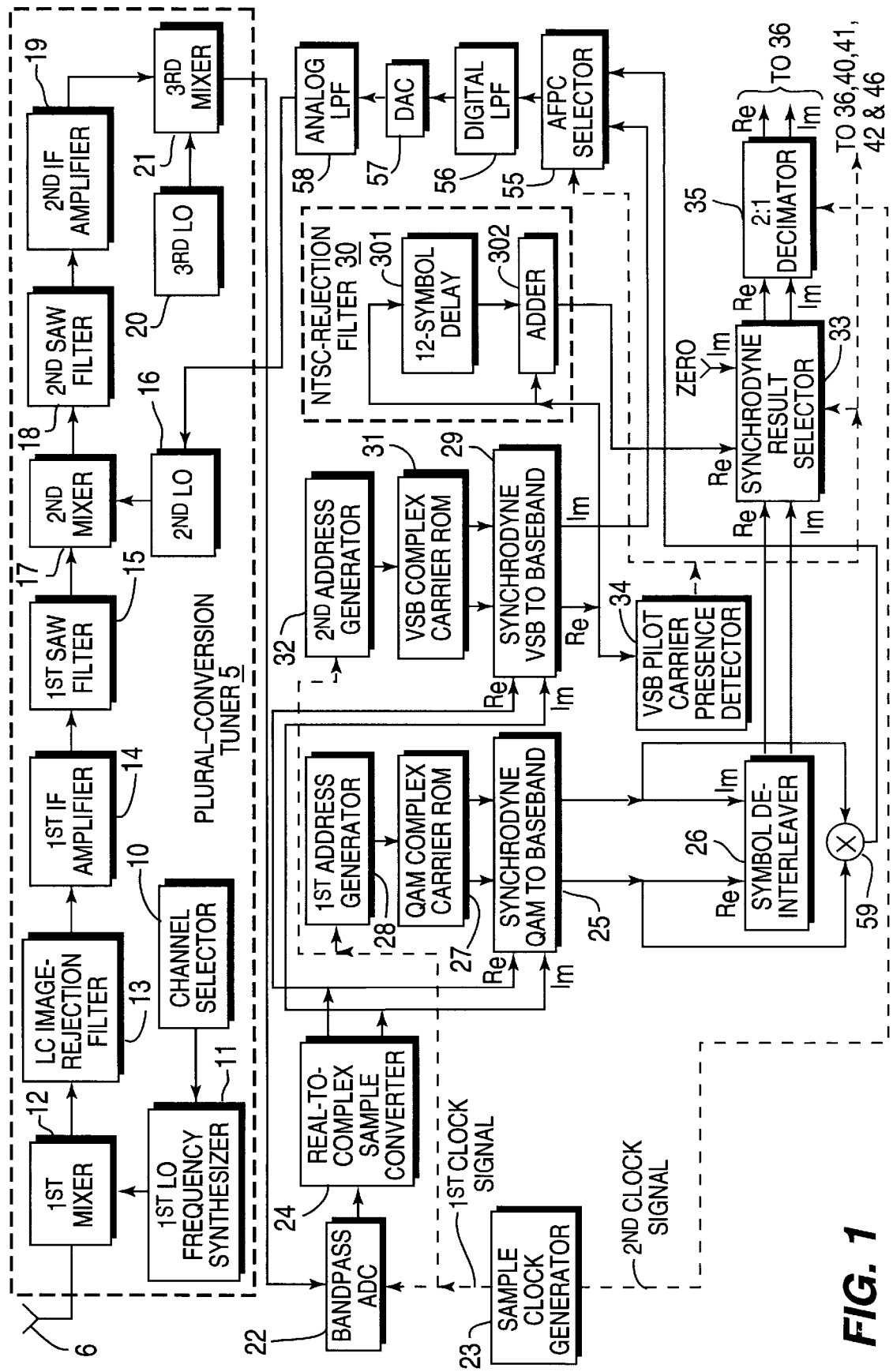
FIG. 1 is a block schematic diagram of initial portions of a digital HDTV signal radio receiver of a type embodying the invention, including circuitry for detecting symbols in an HDTV signal of QAM type, and circuitry for detecting symbols in an HDTV signal of VSB type, and for symbols selected from the circuitry for detecting symbols in an HDTV signal of QAM type and the circuitry for detecting symbols in an HDTV signal of VSB type.

FIG. 1 shows a tuner 5 comprising elements 11–21 that selects one of channels at different locations in the frequency band for digital HDTV signals and performs plural frequency conversion of the selected channel to a final intermediate-frequency signal in a final intermediate-frequency band. FIG. 1 shows a broadcast receiving antenna 6 arranged to capture the digital HDTV signals for the tuner 5. Alternatively, the tuner 5 can be connected for receiving digital HDTV signals from a narrowcast receiving antenna or from a cablecast transmission system.

More particularly, in the tuner 5 shown in FIG. 1, a channel selector 10 designed for operation by a human being determines the frequency of first local oscillations that a frequency synthesizer 11, which functions as a first local oscillator, furnishes to a first mixer 12 for heterodyning with digital HDTV signals received from the antenna 6 or an alternative source of such signals. The first mixer 12 upconverts the received signals in the selected channel to prescribed first intermediate frequencies (e.g., with 920 MHz carrier), and an LC filter 13 is used to reject the unwanted image frequencies that accompany the upconversion result supplied from the first mixer 12. The first intermediate-frequency signal resulting from the upconversion, supplied as the filter 13 response, is applied as the input signal to a first intermediate-frequency amplifier 14, which supplies amplified first IF signal for driving a first surface-acoustic-wave (SAW) filter 15. The upconversion to the rather high-frequency first intermediate frequencies facilitates the SAW filter 15 having a large number of poles and zeroes. Second local oscillations from a second local oscillator 16 are supplied to a second mixer 17 for heterodyning with the response of the first SAW filter 15, to generate second intermediate frequencies (e.g., with 41 MHz carrier). A second SAW filter 18 is used for rejecting the unwanted image frequencies that accompany the downconversion result supplied from the second mixer 17. During the period of transition from NTSC television transmissions to digital television transmissions, the second SAW filter 18 will usually include traps for sound and video carriers of adjacent-channel NTSC television transmissions. The second IF signal supplied as the response of the second SAW filter 18 is applied as input signal to a second intermediate-frequency amplifier 19, which generates an amplified second IF signal response to its input signal. Oscillations from a third local oscillator 20 are heterodyned with the amplified second IF signal response in a third mixer 21. The plural-conversion tuner 5 as thus far described resembles those previously proposed by others, except that the frequency of the oscillations from the third local oscillator 20 is chosen such that the third mixer 21 supplies a third intermediate-frequency signal response.

This third IF signal response is the final intermediate-frequency output signal of the tuner 5, which is supplied to a subsequent analog-to-digital converter (ADC) 22 for digitization. This final IF signal occupies a frequency band 6 MHz wide, the lowest frequency of which is above zero frequency. The lowpass analog filtering of the third mixer 21 response done in the ADC 22 as a preliminary step in analog-to-digital conversion suppresses the image frequencies of the third intermediate frequencies, and the second SAW filter 18 has already restricted the bandwidth of the third intermediate-frequency signals presented to the ADC 22 to be digitized; so the ADC 22 functions as a bandpass analog-to-digital converter. The sampling of the lowpass analog filter response in the ADC 22 as the next step in analog-to-digital conversion is done responsive to pulses in a first clock signal supplied from a sample clock generator 23.

The sample clock generator 23 preferably includes a crystal oscillator capable of frequency control over a relatively narrow range for generating cissoidal oscillations at a multiple of symbol rate. A symmetrical clipper or limiter generates a square-wave response to these cissoidal oscillations to generate the first clock signal, which the ADC 22 uses to time the sampling of the final IF signal after filtering to limit bandwidth. The frequency of the cissoidal oscillation generated by the crystal oscillator in the sample clock generator 23 can be determined by an automatic frequency and phase control (AFPC) signal developed in response to symbol frequency components of the received HDTV signal, for example, as will be described in detail further on in this specification. The pulses in the first clock signal recur at a 21.52 megasamples-per-second rate, twice the 10.76 megasymbols-per-second symbol rate for VSB signals and four times the 5.38 megasymbols-per-second symbol rate for QAM signals. The ADC 22 supplies real digital responses of 10-bit or so resolution to the samples of the band-limited final IF signal, which digital responses are converted to complex digital samples by the circuitry 24. Various ways to construct the circuitry 24 will be described further on in this specification with reference to FIGS. 6, 7, 8 and 9. If the frequency band 6 MHz wide occupied by the final IF signal has a lowest frequency of at least a megaHertz or so, it is possible to keep the number of taps in a Hilbert transformation filter within the circuitry 24 reasonably small and thus keep the latency time of the filter reasonably short. Placing the final IF signal so its mid-frequency is above 5.38 MHz reduces the number of 21.52 megasamples-per-second rate samples in the QAM carrier to less than four, which undesirably reduces the uniformity of synchrodyne response supplied for symbol decoding.

In the FIG. 1 receiver circuitry the complex digital samples of final IF signal supplied from the circuitry 24 are applied to circuitry 25 for synchrodyning the QAM signal to baseband to supply in parallel to a symbol de-interleaver 26 a stream of real samples and a stream of imaginary samples descriptive of the complex-amplitude-modulation modulating signal. The QAM synchrodyning circuitry 25 receives complex-number digital descriptions of two phasings of the QAM carrier, as translated to final intermediate frequency and in quadrature relationship with each other, from read-only memory 27. ROM 27, which comprises sine and cosine look-up tables for QAM carrier frequency, is addressed by a first address generator 28. The first address generator 28 includes an address counter (not explicitly shown in FIG. 1) for counting the recurrent clock pulses in the first clock signal generated by the sample clock generator 23. The resulting address count is augmented by a QAM de-rotator term generated by AQN de-rotator circuitry, thereby to generate the addressing for the ROM 27. The QAM synchrodyne circuitry 25, the first address generator 28, and the operation of each will be explained in greater detail further on in this specification.

In the FIG. 1 receiver circuitry the complex digital samples of final IF signal supplied from the circuitry 24 are also applied to circuitry 29 for synchrodyning the VSB signal to baseband to supply a stream of real samples descriptive of the vestigial-sideband modulating signal to an NTSC-rejection filter 30, which functions as a symbol de-interleaver for the VSB signal. The VSB synchrodyning circuitry 29 receives complex-number digital descriptions of two phasings of the VSB carrier, as translated to final intermediate frequency and in quadrature relationship with each other, from read-only memory 31. ROM 31, which comprises sine and cosine look-up tables for VSB carrier frequency, is addressed by a second address generator 32. The second address generator 32 includes an address counter (not explicitly shown in FIG. 1) for counting the recurrent clock pulses in the first clock signal generated by the sample clock generator 23, which address counter in preferred embodiments of the invention is the same address counter used in the first address generator 28. The resulting address count is augmented by a symbol phase correction term generated by symbol phase correction circuitry, thereby to generate the addressing for the ROM 31. The VSB synchrodyne circuitry 29, the second address generator 32, and the operation of each will be explained in greater detail further on in this specification.

The baseband response of the VSB synchrodyne circuitry 29 is supplied to an NTSC-rejection filter 30 for suppressing co-channel interference from NTSC signals, in which filter 30 the response is applied as input signal to a clocked delay line 301 and as a first summand input signal to a two-input digital adder 302. The clocked delay line 301 supplies a response to its input signal after a delay equal to twelve symbol epochs, which delayed response is applied to the digital adder 302 as its second summand input signal. The clocked delay line 301 and the digital adder 302 in the NTSC-rejection filter 30 cooperate so as to suppress co-channel interference from NTSC signals. The NTSC-rejection filter 30, which is a comb filter, is required as long as NTSC signals are being transmitted over the same channel allocations as digital HDTV signals. The filter 30 suppresses the NTSC luminance carrier and its lower-frequency sidebands containing synchronizing information, very strongly rejects the color subcarrier, suppresses the chrominance sidebands, and suppresses the FM audio carrier. The filter 30 supplies a fifteen-coding-level signal in response to the eight-coding-level signal it receives from the VSB synchrodyne circuitry 29.

A digital-signal multiplexer 33 functions as a synchrodyne result selector that selects as its response either a first or a second one of two complex digital input signals thereto, the selection being controlled by a detector 34 for detecting the zero-frequency term of the real samples from the VSB synchrodyne circuitry 29. When the zero-frequency term has essentially zero energy, indicating the absence of pilot carrier signal that accompanies a VSB signal, the multiplexer 33 selectively responds to its first complex digital input signal, which is the de-interleaved QAM synchrodyne-to-baseband result supplied from the de-interleaver 26. When the zero-frequency term has substantial energy, indicating the presence of pilot carrier signal that accompanies a VSB signal, the multiplexer 33 selectively responds to its second complex digital input signal, the real terms of which are supplied from the NTSC-rejection filter 30 and the imaginary terms of which are all wired arithmetic zero.

The response of the synchrodyne result selection multiplexer 33 is resampled in response to a second clock signal from the sample clock generator 23 in 2:1 decimation circuitry 35, to reduce the sample rate of complex baseband response down to the 10.76 MHz VSB symbol rate, which is twice the 5.38 MHz QAM symbol rate. The 2:1 decimation of the multiplexer 33 response prior to its application as input signal to an amplitude-and-group-delay equalizer 36 reduces the hardware requirements on the equalizer. Alternatively, rather than 2:1 decimation circuitry 35 being used after the synchrodyne result selection multiplexer 33, the baseband responses of the QAM synchrodyne circuitry 25 and of the VSB synchrodyne circuitry 29 can each be resampled in response to a second clock signal from the sample clock generator 23 to carry out 2:1 decimation before the synchrodyne result selection multiplexer 33.

Figure 2:
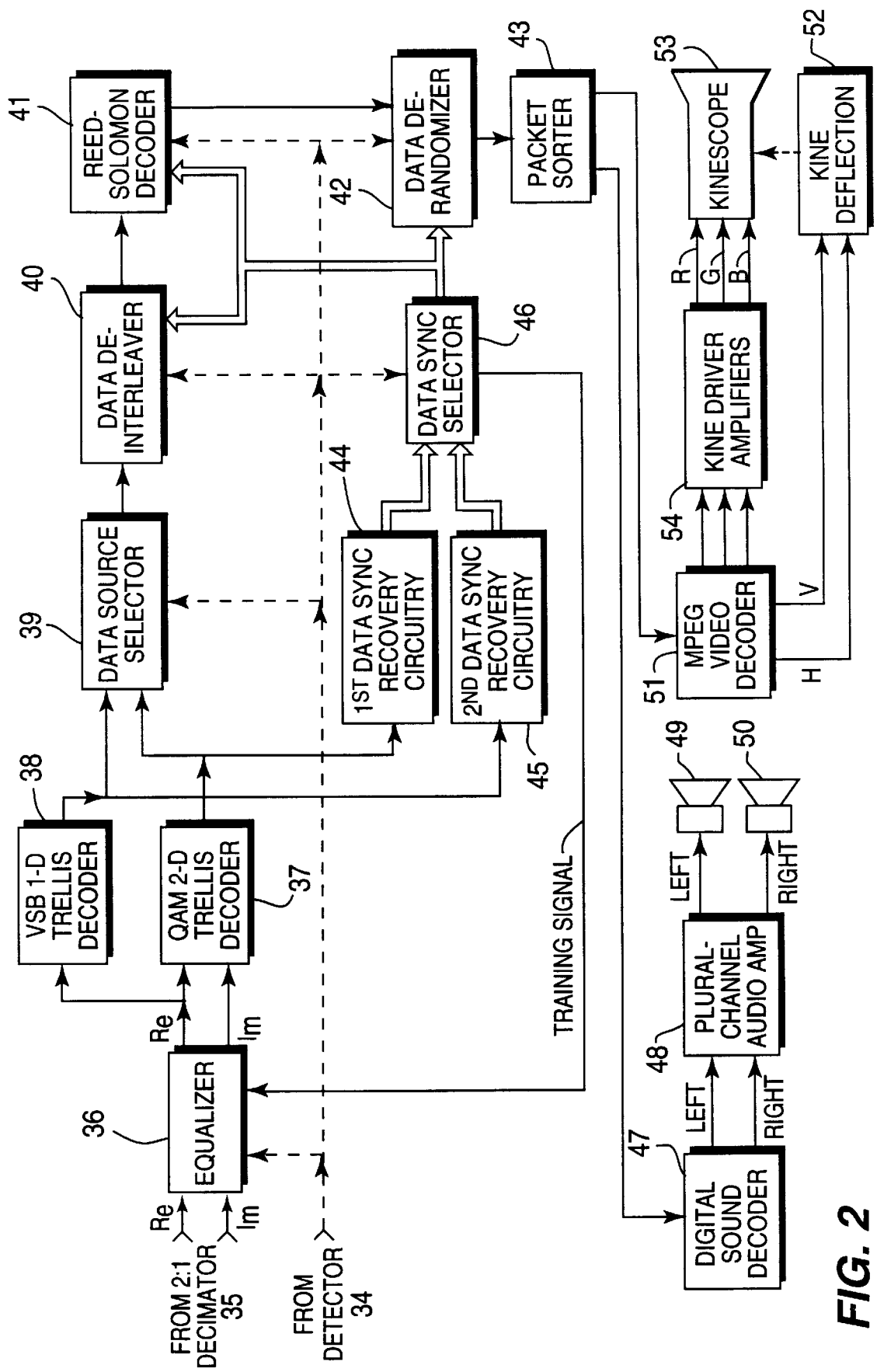
FIG. 2 is a block schematic diagram of the remaining portions, including an amplitude and group delay equalizer, of the digital HDTV signal radio receiver of a type embodying the invention, which are not shown in FIG. 1.

FIG. 2 shows the amplitude-and-group-delay equalizer 36, which converts a baseband response with an amplitude-versus-frequency characteristic that tends to cause inter-symbol error to a more optimum amplitude-versus-frequency characteristic that has linear phase delay and minimizes the likelihood of inter-symbol error. The equalizer 36 can be a suitable one of the monolithic ICs available off-the-shelf for use in equalizers. Such an IC includes a multiple-tap digital filter used for amplitude equalization, the tap weights of which filter are programmable; circuitry for selectively accumulating training signal and temporarily storing the accumulation results; and a microcomputer for comparing the temporarily stored accumulation results with an ideal training signal as known a priori and for calculating updated tap weights of the multiple-tap digital filter used for amplitude equalization. These calculations also use decision feedback based on the received data and the least-mean-squares (LMS) algorithm to reduce intersymbol errors.

The response of the equalizer 36 is applied as input signal to a two-dimensional trellis decoder 37, which performs the symbol decoding that recovers a digital data stream from a QAM-origin signal. The response of the equalizer 36 is also applied as input signal to a one-dimensional trellis decoder 38, which performs the symbol decoding that recovers a digital data stream from a VSB-origin signal. A digital-signal multiplexer 39 functions as a data source selector that selects as its response either a first or a second one of two digital input signals thereto, the selection being controlled by the detector 34 for detecting the zero-frequency term of the real samples from the VSB synchrodyne circuitry 29. When the zero-frequency term has essentially zero energy, indicating the absence of pilot carrier signal that accompanies a VSB signal, the multiplexer 39 selectively responds to its first digital input signal, selecting as the source of its digital data output the two-dimensional trellis decoder 37 that decodes the symbols received in the QAM signal. When the zero-frequency term has substantial energy, indicating the presence of pilot carrier signal that accompanies a VSB signal, the multiplexer 39 selectively responds to its second digital input signal, selecting as the source of its digital data output the one-dimensional trellis decoder 38 that decodes the symbols received in the VSB signal.

The data selected by the data source selection multiplexer 39 are applied to a data de-interleaver 40 as its input signal, and the de-interleaved data supplied from the data de-interleaver 40 are applied to a Reed-Solomon decoder 41. The data de-interleaver 40 is often constructed within its own monolithic IC and is made so as to respond to the output indications from the pilot carrier presence detector 34 to select the de-interleaving algorithm suitable to the HDTV signal currently being received, whether it be of QAM or VSB type; this is a mere matter of design. The Reed-Solomon decoder 41 is often constructed within its own monolithic IC and is made so as to respond to the output indications from the pilot carrier presence detector 34 to select the appropriate Reed-Solomon decoding algorithm for the HDTV signal currently being received, whether it be of QAM or VSB type; this also is a mere matter of design. Error-corrected data are supplied from the Reed-Solomon decoder 41 to a data de-randomizer 42, which regenerates packets of data for a packet sorter 43. The data de-randomizer 42 is made so as to respond to the output indications from the pilot carrier presence detector 34 to select the appropriate data de-randomizing algorithm for the HDTV signal currently being received, whether it be of QAM or VSB type; this is a mere matter of design, too.

First data synchronization recovery circuitry 44 recovers the data synchronizing information included in the data output of the two-dimensional trellis decoder 37, and second data synchronization recovery circuitry 45 recovers the data synchronizing information included in the data output of the one-dimensional trellis decoder 38. A data sync selector 46 selects between the data synchronizing information as provided by the data sync recovery circuitry 44 and as provided by the data sync recovery circuitry 45, the selection being controlled by the detector 34 for detecting the zero-frequency term of the real samples from the VSB synchrodyne circuitry 29. When the zero-frequency term has essentially zero energy, indicating the absence of pilot carrier signal that accompanies a VSB signal, the data sync selector 46 selects for its output signals the data synchronizing information provided by the data sync recovery circuitry 44. When the zero-frequency term has substantial energy, indicating the presence of pilot carrier signal that accompanies a VSB signal, the data sync selector 46 selects for its output signals the data synchronizing information provided by the data sync recovery circuitry 45.

A VSB HDTV signal comprises a succession of consecutive-in-time data fields each containing 314 consecutive-in-time data lines. Each line of data starts with a line synchronization code group of four symbols having successive values of +S, −S, −S and +S. The value +S is one level below the maximum positive data excursion, and the value -S is one level above the maximum negative data excursion. The lines of data are each of 77.7 microsecond duration, and there are 832 symbols per data line for a symbol rate of about 10 megabits/second. The initial line of each data field is a field synchronization code group that codes a training signal for channel-equalization and multi-path suppression procedures. The training signal is a 511-sample pseudo-random sequence (or "PR-sequence") followed by three 63-sample PR sequences. This training signal is transmitted in accordance with a first logic convention in the first line of each odd-numbered data field and in accordance with a second logic convention in the first line of each even-numbered data field, the first and second logic conventions being one's complementary respective to each other. When the data sync selector 46 selects for its output signals the data synchronizing information provided by the data sync recovery circuitry 45, the initial data lines of each data field are selected for application to the equalizer 36 as training signal. The occurrences of two consecutive 63-sample PR sequences are detected within the data sync recovery circuitry 45 to provide data-field indexing information to the data sync selector 46.

The standards for a QAM HDTV signal are not as well defined at this time as the standards for a VSB HDTV signal. A 32-state QAM signal provides sufficient capacity for a single HDTV signal, without having to resort to compression techniques outside MPEG standards, but commonly some compression techniques outside MPEG standards are employed to encode the single HDTV signal as a 16-state QAM signal. The occurrence of a prescribed 24-bit word is detected by the data sync recovery circuitry 44 to generate data-field indexing information for application to the data sync selector 46. A multiplexer within the data sync selector 46 selects between the data-field indexing information respectively supplied by the data sync recovery circuitry 44 and the data sync recovery circuitry 45; the data-field indexing information thus selected is supplied to the data de-interleaver 40, the Reed-Solomon decoder 41, and the data de-randomizer 42. At the time this specification is written there is no training signal included in the QAM HDTV signal. Accordingly, the amplitude-and-group-delay equalizer 36 is arranged to provide a flat amplitude-versus-frequency characteristic in response to the VSB pilot carrier presence detector 34 indicating the absence of pilot carrier, and the VSB training signal selected by the data sync recovery circuitry 45 is wired through the data sync selector 46 without need for a multiplexer. Also, there is no data line synchronization signal for QAM HDTV transmission, at least not one selected as a standard. The data sync recovery circuitry 44 includes counting circuitry for counting the samples in each data field to generate intra-data-field synchronizing information. This intra-data-field synchronizing information and the intra-data-field synchronizing information (such as data line count) generated by the data sync recovery circuitry 45 are selected between by appropriate multiplexers in the data sync selector 46, for application to the data de-interleaver 40, the Reed-Solomon decoder 41, and the data de-randomizer 42, as required.

The packet sorter 43 sorts packets of data for different applications, responsive to header codes in the successive packets of data. Packets of data descriptive of the audio portions of the HDTV program are applied by the packet sorter 43 to a digital sound decoder 47. The digital sound decoder 47 supplies left-channel and right-channel stereophonic sound signals to a plural-channel audio amplifier 48 that drives the plurality of loudspeakers 49, 50. Packets of data descriptive of the video portions of the HDTV program are applied by the packet sorter 43 to an MPEG decoder 51. The MPEG decoder 51 supplies horizontal (H) and vertical (V) synchronizing signals to kinescope deflection circuitry 52 that provides for the raster scanning of the viewing screen of a kinescope 53. The MPEG decoder 51 also supplies signals to the kinescope driver amplifiers 54 for applying amplified red (R), green (G) and blue (B) drive signals to the kinescope 53. In variations of the HDTV receiver shown in FIGS. 1 and 2, a different display device may be used instead of or in addition to the kinescope 53, and the sound recovery system may be different, consisting of but a single audio channel, or being more elaborate than a simple stereophonic reproduction system.

Referring back to FIG. 1, in order that ROMs 27 and 31 can be used to generate digital complex-number descriptions of the QAM and VSB signal carriers as translated to respective final intermediate frequencies, in response to addressing generated by counting first clock signals, provision must be made to lock the one those final intermediate frequencies that is the carrier of the currently received HDTV signal to a submultiple of a multiple of the first clock signal frequency. That is, those final intermediate frequencies must be in whole number ratios with the first clock signal frequency. An automatic phase and frequency control (AFPC) signal is developed in the digital circuitry following the analog-to-digital converter 22 and is used to control the frequency and phase of one of the local oscillators 11, 16 and 20 in the tuner. Using a fixed-frequency third local oscillator 20, and controlling the frequency and phase of the oscillations the second local oscillator 16 provides, is preferred in that alignment of the second IF signal with the second SAW filter 18 can be readily assured. The second SAW filter 18 usually contains traps for adjacent-channel signal components, in which case proper alignment of the second IF signal between these traps is important for preserving its integrity. The symbol clocking is made to exhibit a high degree of frequency stability. By locking the carrier of the final intermediate-frequency (IF) signal in frequency and phase to a submultiple of a multiple of the symbol clock frequency, the AFPC for correcting frequency and phase error in the carrier as translated to a final intermediate frequency invariably operates to correct dynamic symbol phase error as well, eliminating the need for a separate phase tracker to correct dynamic symbol phase error.

FIG. 1 denominates a digital multiplexer 55 as "AFPC selector". The multiplexer 55 responds to the pilot carrier presence detector 34 indicating that a pilot carrier is included in the currently received HDTV signal for selecting, as an input signal for a digital lowpass filter 56, the imaginary output signal of the baseband response of the VSB synchrodyne circuitry 29. The response of lowpass filter 56 is a digital AFPC signal supplied as input signal to a digital-to-analog converter (DAC) 57. The output signal from the DAC 57 is an analog AFPC signal, which is subjected to further lowpass filtering in an analog lowpass filter 58, the response of which filter 58 is used for controlling the frequency and phase of the oscillations that the second local oscillator 16 provides. Analog lowpass filtering is advantageous to use for realizing long-time-constant lowpass filtering because there is reduced need for active devices as compared to digital lowpass filtering. Since the shunt capacitor of a resistance-capacitance lowpass filter section can be at the interface between a tuner 5 IC and the IC containing the digital synchrodyning circuitry, the analog lowpass filtering can be done without any cost in IC pin-out. Doing some digital lowpass filtering is advantageous, however, since the digital lowpass filter response can be subsampled to the DAC 57; the reduced speed requirements on the digital-to-analog conversion reduces the cost of the DAC 57. This procedure is similar to that used in the AGC circuitry described at the end of this specification with reference to FIG. 12 of the drawing, and the third clock signal developed for the AGC circuitry can be used by the DAC 57 and can be used to reset an accumulator the digital lowpass filter 56 includes for averaging samples of filter input signal.

The multiplexer 55 responds to the pilot carrier presence detector 34 indicating that a pilot carrier is not included in the currently received HDTV signal for selecting the input signal for the digital lowpass filter 56 from the circuitry for processing a QAM HDTV signal. FIG. 1 shows the product output signal of a digital multiplier 59 being provided for such selection. The digital multiplier 59 multiplies together the real and imaginary output signals of the QAM synchrodyne circuitry 25 to generate an unfiltered digital AFPC signal. The generation of the unfiltered digital AFPC signal is very similar to that in the well-known Costas loop. In the Costas loop the AFPC signal is used to control the frequency and phase of the digital local oscillations used for synchrodyning received signals to baseband. The FIG. 1 arrangement departs from this procedure, the AFPC signal being used instead to control the frequency and phase of the analog oscillations generated by the second local oscillator 16. This regulates the frequency and phase of the final IF signal supplied to the ADC 22 for digitization and for subsequent synchrodyning to baseband in the digital regime. As is the case with the Costas loop, the multiplier 59 is preferably of especial design in which the real signal is converted to a ternary signal for multiplying the imaginary signal; this simplifies the digital multiplier and improves the pull-in characteristics of the AFPC loop.

Although not explicitly shown in FIGS. 1 and 2, preferably circuitry is provided to sense when there is co-channel interference from NTSC signal, to by-pass the filter 30 when no co-channel interference from NTSC signal is sensed, and to adjust symbol decoding ranges in the one-dimensional trellis decoder 38 in accordance with the number of coding levels to be expected. There is less likelihood of the occurrence of erroneous decisions as to symbol identity when eight coding levels have to be discerned than when fifteen coding levels have to be discerned.

The second intermediate-frequency amplifier 19, the third local oscillator 20 (except for its outboard crystal and other frequency selection components), and the third mixer 21 are advantageously constructed within the confines of a monolithic IC; since the output signal of the third mixer 21 is at a different frequency than the input signal to the second IF amplifier 19, the second IF amplifier 19 can have high gain without attendant high risk of unwanted regeneration. The first IF amplifier 14, the second local oscillator 16 (except for its outboard crystal and other frequency selection components) and the second mixer 17 can be constructed within the confines of the same IC, or they may be constructed otherwise—e.g., within other integrated circuitry. The analog-to-digital converter (ADC), as customary, will be a flash type with at least ten bits resolution and is preferably constructed within the confines of a different monolithic IC than the IF amplifiers. The analog lowpass filter at the input of the converter isolates the sampling circuitry, with its associated switching transients, from the IC in which the high-gain second IF amplifier 19 is located (and in some cases, in which the first IF amplifier 14 is also located). This reduces the likelihood of unwanted regeneration in the tuner 5. Considerable die area is required for the resistance ladder used in establishing the quantizing levels and for the large number of analog comparators involved in an ADC of flash type, so often such an ADC does not share a monolithic IC with other elements anyway.

The sample clock generator 23 and the circuitry 24 for converting the digitized final IF signal supplied from the ADC 22 to complex digital samples of final IF signal are advantageously shared by the circuitry for synchrodyning VSB HDTV signals to baseband and by the circuitry for synchrodyning QAM HDTV signals to baseband, as are portions of the address generators 28 and 32 in preferred embodiments of the invention, the inventors point out. Accordingly, the circuitry for synchrodyning VSB HDTV signals to baseband and the circuitry for synchrodyning QAM HDTV signals to baseband are advantageously constructed within the confines of a single monolithic. The inventors further point out that it is advantageous that this single monolithic IC and the following circuitry include all the circuitry for automatically selecting the appropriate mode of reception for the HDTV transmission currently being received. Such practice avoids the need for operating the third local oscillator at two markedly different frequencies, depending on whether an HDTV signal is of QAM type or is of VSB type. Operation of the third local oscillator at two markedly different frequencies is normally associated with the use of two different crystals for setting those frequencies. Operating the third local oscillator at essentially the same frequency, no matter whether the HDTV signal is of QAM type or is of VSB type, saves the cost of the extra crystal and of the electronic switching circuitry involved with the use of two crystals. Furthermore, the reliability of the tuner 5 is improved by the reduction in the amount of circuitry located outside the monolithic integrated circuitry.

If the ADC is not constructed within an IC, all or substantially all its own, it is advantageous to include it in the IC that contains the circuitry for synchrodyning VSB HDTV signals and the circuitry for synchrodyning QAM HDTV signals to baseband, since the signals for clocking the sampling of the final IF signal by the ADC are to be generated within that IC. Furthermore, the analog lowpass filter at the input of the converter still isolates the sampling circuitry, with its associated switching transients, from the IC(s) in which high-gain IF amplification is done.

Figure 3:
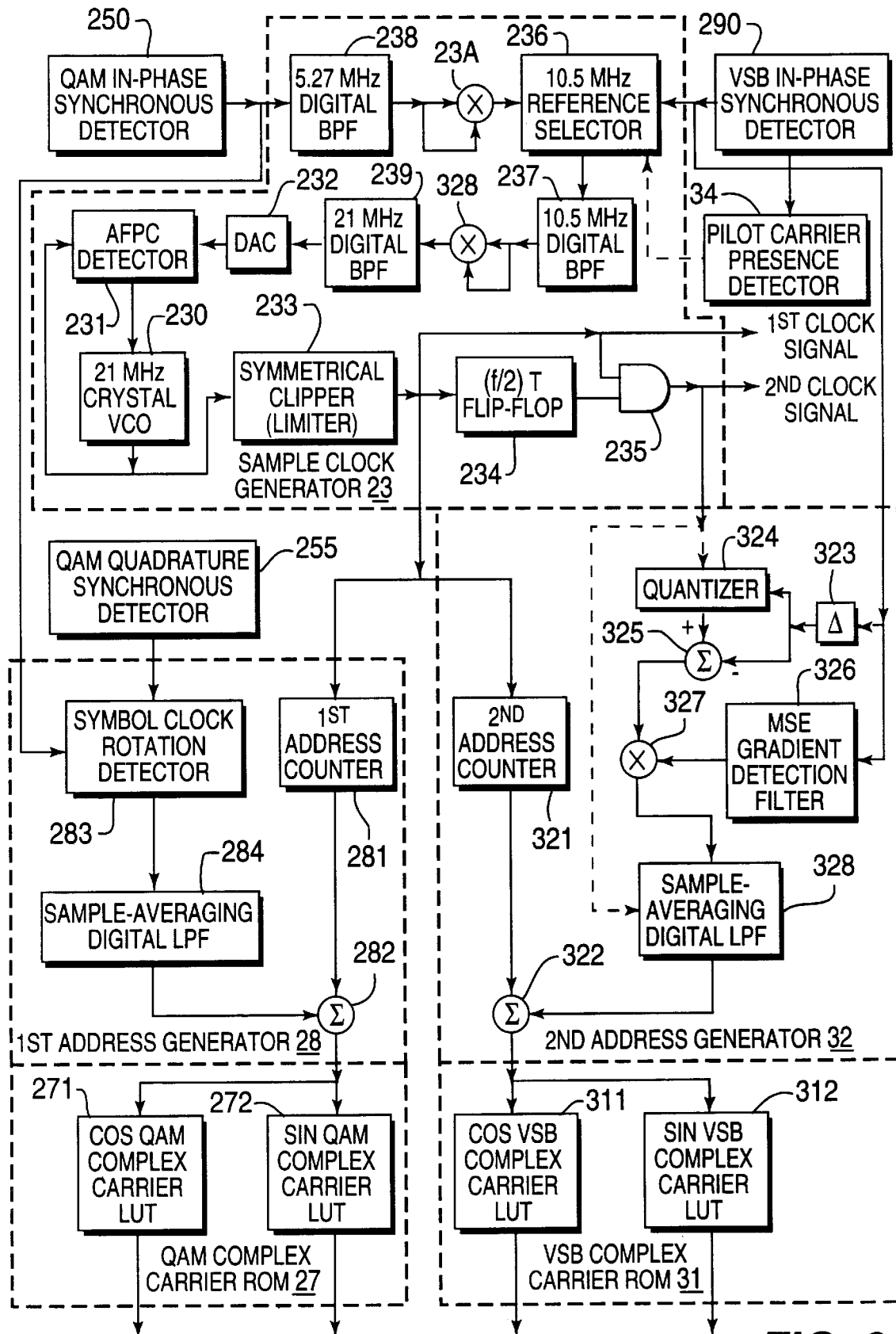
FIG. 3 is a detailed block schematic diagram of circuitry for providing the sample clock generator, the look-up table read-only memories (ROMs) for supplying digital descriptions of the complex carriers used for synchrodyning digital QAM signals and digital VSB signals at final IF signal frequencies each to baseband, and the address generators for those ROMs, which circuitry is included in certain digital HDTV signal radio receivers of the type embodying the invention.

FIG. 3 shows in detail a representative construction of the sample clock generator 23. This construction includes a voltage-controlled oscillator 230 that generates cissoidal oscillations nominally of 21.52 MHz frequency. The oscillator 230 is a voltage controlled oscillator, the frequency and phase of its oscillations being controlled by an automatic frequency and phase control (AFPC) signal. This AFPC signal is generated by an automatic frequency and phase control (AFPC) detector 231, which compares the oscillations of the oscillator 230 with a 21.52 MHz reference carrier supplied from a digital-to-analog converter (DAC) 232. Preferably, oscillator 230 is of a type using a crystal for stabilizing the natural frequency and phase of its oscillations. A symmetrical clipper or limiter 233 generates a squarewave response to these cissoidal oscillations, which is used as the first clock signal for timing the sampling of the final IF signal in the ADC 22. A frequency-divider flip-flop 234 responds to transitions of the first clock signal in a prescribed sense for generating another square wave which an AND circuit 235 ANDs with the first clock signal for generating a second clock signal used by the 2:1 decimator 35 shown in FIG. 1.

The 21.52 MHz reference carrier supplied from the digital-to-analog converter 232 is generated by detecting the strong symbol frequency component of the received HDTV signal, as synchrodyned to baseband, and multiplying the symbol frequency up by an appropriate factor through squaring a suitable number of times. These procedures will now be described, first presuming the received HDTV signal is a VSB signal with a 10.76 MHz symbol frequency that must be squared once to generate the 21.52 MHz reference carrier, and then presuming the received HDTV signal is a QAM signal with a 5.38 MHz symbol frequency that must be squared twice to generate the 21.52 MHz reference carrier.

A digital multiplexer 236 responds to the pilot carrier presence detector 34 detecting pilot carrier accompanying the received HDTV signal, which is indicative that the received HDTV signal is a VSB signal, to select the real samples of this signal supplied from a VSB in-phase synchronous detector 290 for application to a bandpass FIR digital filter 237 that provides a selective response centered at 10.76 MHz, which selects the 10.76 MHz symbol frequency of the VSB signal. The filter 237 response is squared by a digital multiplier 238, which multiplier 238 can either be constructed from logic gates or provided by a ROM storing a look-up table of squares. The product output signal from the digital multiplier 238 operated to square samples has a strong component at the second harmonic of the 10.76 MHz component of the filter 237 response, and a bandpass FIR digital filter 239 that provides a selective response centered at 21.52 MHz selects this second harmonic for application to the DAC 232 as its digital input signal descriptive of its 21.52 MHz reference carrier analog output signal.

Figure 5:
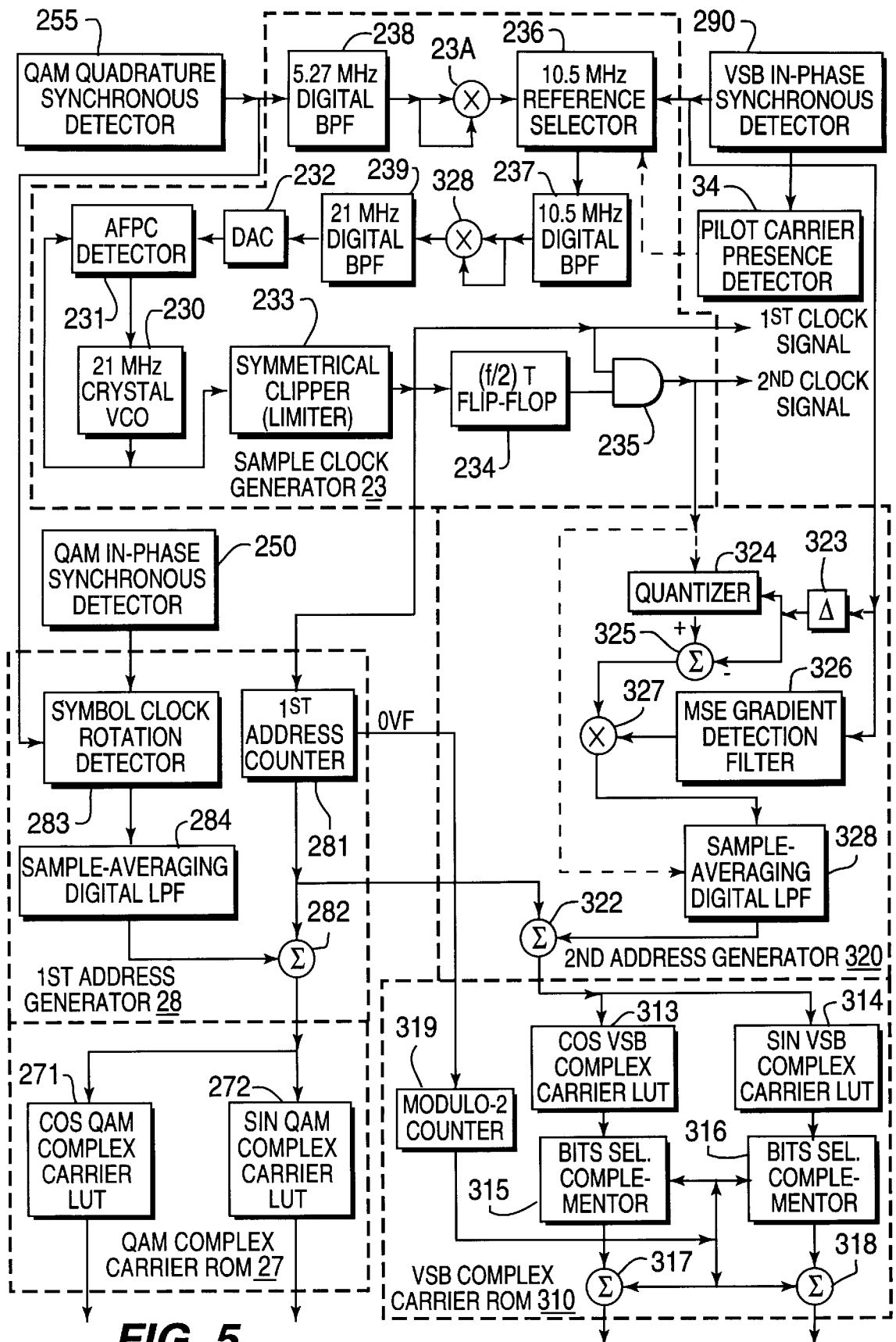
FIG. 5 is a detailed block schematic diagram of circuitry similar to that of FIG. 3, modified so that the address generator for the ROMs supplying digital descriptions of the complex carrier used for synchrodyning digital QAM signals to baseband and the ROMs supplying digital descriptions of the complex carrier used for synchrodyning digital VSB signals to baseband share an address counter in common.

The digital multiplexer 236 responds to the pilot carrier presence detector 34 not detecting pilot carrier accompanying the received HDTV signal, which is indicative that the received HDTV signal is a QAM signal, to select the product output signal of a digital multiplier 23A for application to the bandpass filter 237 that provides a selective response centered at 10.76 MHz. The digital multiplier 23A, which multiplier 23A can either be constructed from logic gates or provided by a ROM storing a look-up table of squares, squares the samples supplied from a bandpass FIR digital filter 23B that provides a selective response centered at 5.38 MHz, which selects the 5.38 MHz symbol frequency of a baseband QAM signal. This baseband QAM signal can be supplied either from a QAM in-phase synchronous detector 250, as shown in FIG. 3, or from a QAM quadrature-phase synchronous detector 255, as shown in FIG. 5.

FIG. 3 also shows in more detail a representative construction of the first address generator 28, which supplies addresses to a cosine look-up table portion 271 and a sine look-up table portion 272 of the ROM 27 that provides complex-number digital descriptions of two phasings of the QAM carrier, as translated to a final intermediate frequency and in quadrature relationship with each other. Transitions of the first clock signal are counted by a first address counter 281 in the first address generator 28 to generate a basic first address signal. This basic first address signal is applied as a first summand to a digital adder 282. A first address correction signal, which is applied to the adder 282 as a second summand, adds to the basic first address signal in the adder 282 for generating as a sum output signal a corrected first address signal for addressing both the cosine look-up table portion 271 and the sine look-up table portion 272 of the ROM 27. A symbol-clock-rotation detector 283 responds to the sequence of real samples of QAM signal as synchrodyned to baseband by the QAM in-phase synchronous detector 250 and to the sequence of imaginary samples of QAM signal as synchrodyned to baseband by the QAM quadrature-phase synchronous detector 255. The symbol-clock-rotation detector 283 detects the misphasing between symbol clocking done at the receiver in accordance with the first clock signal and symbol clocking done at the transmitter, as evidenced in the received QAM signal heterodyned to a final intermediate frequency that is a submultiple of its symbol frequency. Several types of symbol-clock-rotation detector 283 are described and background literature describing certain of them are catalogued in U.S. Pat. No. 5,115,454 issued May 19, 1992 to A. D. Kucar, entitled METHOD AND APPARATUS FOR CARRIER SYNCHRONIZATION AND DATA DETECTION, and incorporated herein by reference. A digital lowpass filter 284 averages over many samples (e.g., several million) the misphasing of the symbol clocking done at the receiver as detected by the symbol-clock-rotation detector 283 to generate the first address correction signal supplied to the adder 282 to correct the basic first address. Averaging over so many samples can be done by procedures which accumulate lesser numbers of samples and dump them forward at a reduced sample rate for further accumulation, accumulation and subsampling being repeated a few times with progressively lower subsampling rates.

FIG. 3 also shows in more detail a representative construction of the second address generator 32, which supplies addresses to a cosine look-up table portion 311 and a sine look-up table portion 312 of the ROM 31 that provides complex-number digital descriptions of two phasings of the VSB carrier, as translated to a final intermediate frequency and in quadrature relationship with each other. Transitions of the first clock signal are counted by a second address counter 321 in the second address generator 32 to generate a basic second address signal. This basic second address signal is applied as a first summand to a digital adder 322. A second address correction signal, which is applied to the adder 322 as a second summand, adds to the basic second address signal in the adder 322 for generating as a sum output signal a corrected second address signal for addressing both the cosine look-up table portion 311 and the sine look-up table portion 312 of the ROM 31.

FIG. 3 shows a clocked digital delay line 323 for delaying the samples from the in-phase synchronous detector 290 by a prescribed number of sample periods prior to their being applied as input signal to a quantizer 324, which supplies the quantization level most closely approximated by the sample currently received by the quantizer 324 as input signal. The quantization levels can be inferred from the energy of the pilot carrier accompanying the VSB signal or can be inferred from the result of envelope detection of the VSB signal. The closest quantization level selected by the quantizer 324 as its output signal has the corresponding quantizer 324 input signal subtracted therefrom by a digital adder/subtractor 325, which is operated as a clocked element by including a clocked latch at its output. The difference output signal from the adder/subtractor 325 describes the departure of the symbol levels actually recovered from those that should be recovered, but whether the polarity of the departure is attributable to symbol misphasing being leading or lagging remains to be resolved.

The samples from the in-phase synchronous detector 290 applied as input signal to the clocked digital delay line 323 are applied without delay as input signal to a mean-square-error gradient detection filter 326. The filter 326 is a finite-impulse-response digital filter having a $(-\frac{1}{2})$, 1, 0, $(-1)$, $(+\frac{1}{2})$ kernel, the operation of which is clocked by the first sampling clock. The prescribed number of sample periods of delay provided by the clocked digital delay line 323 is such that filter 326 response is in temporal alignment with the difference signal from the adder/subtractor 325. A digital multiplier 327 multiplies the difference signal from the adder/subtractor 325 by the filter 326 response to resolve this issue. The sign bit and the next most significant bit of the two's complement filter 326 response suffice for the multiplication, which permits simplification of the digital multiplier 327 structure. The samples of the product signal from the digital multiplier 327 are indications of the misphasing of the symbol clocking done at the receiver that are averaged over many samples (e.g., several million) by a digital lowpass filter 328 for generating the second address correction signal supplied to the adder 322 to correct the basic second address.

The symbol synchronization techniques used in the second address generator 32 shown FIG. 3 (and in FIG. 5) are of the same general type as S. U. H. Qureshi describes for use with pulse amplitude modulation (PAM) signals in his paper "Timing Recovery for Equalized Partial-Response Systems," IEEE Transactions on Communications, December 1976, pp. 1326–1330. These symbol synchronization techniques as used in connection with symbol synchronization for VSB signals are specifically described by the inventors in their earlier-filed applications referenced earlier in this specification. In preferred designs of the general type of second address generator 32 shown FIGS. 3 and 5, the clocked digital delay line 323 does not exist as a separate element; instead, an input signal to the quantizer 324 with the requisite number of sample periods of delay for the difference signal from the adder/subtractor 325 being temporally aligned with the filter 326 response is taken from the tapped digital delay line included in the filter 326 for supplying differentially delayed samples to be weighted by the $(-\frac{1}{2})$, 1, 0, $(-1)$, $(+\frac{1}{2})$ kernel before being summed to generate the filter 326 response.

The carrier of a QAM HDTV signal and the carrier of a VSB HDTV signal are translated to respective intermediate frequencies, each of which is a submultiple of a multiple of the 21.52 MHz sample rate that is the fourth harmonic of the 5.38 MHz symbol frequency of the QAM HDTV signal and that is the second harmonic of the 10.76 MHz symbol frequency of the VSB HDTV signal. These two respective intermediate frequencies are at a 2.375 MHz remove from each other, since the carrier of the QAM HDTV signal is at the center of a 6 MHz-wide TV channel, but the carrier of the VSB HDTV signal is only 625 kHz above the lowest frequency of a 6 MHz-wide TV channel. Preferably the frequencies of the local oscillators 11, 16 and 20 in the tuner 5 are chosen so that the intermediate frequency to which the carrier of a VSB HDTV signal is translated is lower than that to which the carrier of a QAM HDTV signal is translated. This is strongly preferred since it facilitates symbol synchronization when a VSB HDTV signal is received. Preferably the intermediate frequency to which the carrier of a QAM HDTV signal is translated is not more than 5.38 MHz, so that it can be sampled at least four times per cycle in accordance with the 21.52 MHz sample clock, which preference constrains the lowest frequency in the final IF signal to being no higher than 2.38 MHz. Preferably the lowest frequency of the final IF signal is above 1 MHz, to keep the ratio of the highest frequency of the final IF signal thereto substantially below 8:1 and thereby ease the filtering requirements for the real-to-complex-sample converter 24, so the intermediate frequency to which the carrier of a VSB HDTV signal is translated is preferably above 1.625 MHz.

FIG. 4 is a table of subharmonics of the 21.52 MHz sampling frequency and of 43.04 MHz, the second harmonic of the 21.52 MHz sampling frequency, which overlap the frequency range of interest. (A more complete table of subharmonics of low harmonics of the 21.52 MHz sampling frequency can be constructed, of course, but the number of addresses for the ROMs 27 and 31 will have to be extended as higher harmonics of the 21.52 MHz sampling frequency are added to the table and subharmonics of those higher harmonics are subsequently selected to approximate the QAM and VSB carrier frequencies in the final IF signal.) One wishes to select two of the frequencies from the FIG. 4 table that meet the criteria of the previous paragraph for the respective intermediate frequencies to which the carrier of a QAM HDTV signal and the carrier of a VSB HDTV signal are to be translated. The FIG. 4 table includes at the top extreme right therein a column of higher subharmonics of 43.04 MHz decremented by 2.375 MHz, which resulting frequency values can be compared to lower subharmonics of 43.04 MHz as an aid in selecting subharmonics with close to the desired 2.375 MHz offset between them. The ninth and the eighteenth subharmonics of 43.04 MHz exhibit a 16 kHz or 0.67% error in regard to the desired offset; the tenth and twenty-second subharmonics of 43.04 MHz exhibit a 27 kHz or 1.14% error in regard to the desired offset; the eleventh and twenty-eighth subharmonics of 43.04 MHz exhibit only a 1 kHz or 0.04% error in regard to the desired offset; and the twelfth and thirty-sixth subharmonics of 43.04 MHz exhibit only a 16 kHz or 0.67% error in regard to the desired offset. The correction of nominal second local oscillator 16 frequency required to lock each of the QAM and VSB carriers in the final IF signals to their desired submultiple frequencies is a very small percentage of the 960 MHz frequency of its oscillations, so the stability of its oscillations are little affected by its being AFPC'd. The shift of the second intermediate frequencies in as far as they fall into the traps of the second SAW filter 18 is the more significant consideration. The effects of this shift can be countered by changing the frequency of the third local oscillator 20 a few kHz by shunting its crystal tank circuit with switched capacitance during one reception mode. In past commercial designs for NTSC TV receivers, mistuning up to 30 kHz has been tolerated in IF amplifiers constructed with discrete stages having inductors and capacitors as frequency-selective elements, and somewhat greater mistuning has been tolerated in monolithic IF amplifiers using SAW filters.

Referring back to FIG. 3, assuming the tenth and twenty-second subharmonics of 43.04 MHz are to be used as the final intermediate frequencies to which the QAM and VSB HDTV carriers are respectively converted, so the converted VSB carrier is somewhat above 1.625 MHz, the first address counter 281 is arranged to count modulo ten thereby to generate one cycle of ROM 27 addressing, and the second address counter 322 is arranged to count modulo twenty-two thereby to generate one cycle of ROM 31 addressing. If the eleventh and twenty-eighth subharmonics of 43.04 MHz are used as the final intermediate frequencies to which the QAM and VSB HDTV carriers are respectively converted, the first address counter 281 is arranged to count modulo eleven thereby to generate one cycle of ROM 27 addressing, and the second address counter 322 is arranged to count modulo twenty-eight thereby to generate one cycle of ROM 31 addressing. If the twelfth and thirty-sixth subharmonics of 43.04 MHz are used as the final intermediate frequencies to which the QAM and VSB HDTV carriers are respectively converted, the first address counter 281 is arranged to count modulo twelve thereby to generate one cycle of ROM 27 addressing and the second address counter 322 is arranged to count modulo thirty-seven thereby to generate one cycle of ROM 31 addressing.

FIG. 5 shows a modification of the FIG. 3 circuitry that is possible when the ninth and the eighteenth subharmonics of 43.04 MHz are used as the final intermediate frequencies to which the QAM and VSB HDTV carriers are respectively converted. The VSB complex carrier ROM 31 is replaced with a ROM 310 that comprises a portion 313 that stores only one-half cycle of VSB carrier cosine values and a portion 314 that stores only one-half cycle of VSB carrier sine values. In a modification 320 of the second address generator 32 described above, the adder 322 receives the basic first address from the first address counter 281 as its first summand input signal, rather than the basic second address from the second address counter 321. The second address counter 321 is not used in the modified second address generator 320. The first address counter 281 is arranged to count modulo nine, thereby to generate one cycle of ROM 27 addressing and the one half cycle of ROM 310 addressing. A binary counter stage 319 counts overflow carries from the first address counter 281. A selective bits complementor 315 exclusive-ORs the modulo-2 count from the binary counter stage 319 with each of the bits of the VSB carrier cosine values read from the portion 313 of the ROM 310 for generating a first summand input for a digital adder 317, and the modulo-2 count from the binary counter stage 319 is provided with zero extension in the direction of increased significance for generating a second summand input for the adder 317. The sum output from the adder 317 provides the full cycle of VSB carrier cosine values over eighteen first clock periods. A selective bits complementor 316 exclusive-ORs the modulo-2 count from the binary counter stage 319 with each of the bits of the VSB carrier sine values read from the portion 314 of the ROM 310 for generating a first summand input for a digital adder 318, and the modulo-2 count from the binary counter stage 319 with zero extension in the direction of increased significance is also applied as a second summand input for the adder 318. The sum output from the adder 318 provides the full cycle of VSB carrier sine values over eighteen first clock periods.

One skilled in the art of digital circuit design will understand that other hardware savings can be made in the FIG. 3 read-only memory circuitry taking advantage of symmetries in the cosine and sine functions or the 90° offset in the respective phases of these two functions. Arrangements where the sine and cosine values are not read from ROM, but rather are accumulated in parallel in accordance with the sin (A+B)=sin A cos B+cos A sin B and cos (A+B)=cos A cos B−sin A sin B trignometric formulae are another alternative.

Figure 6:
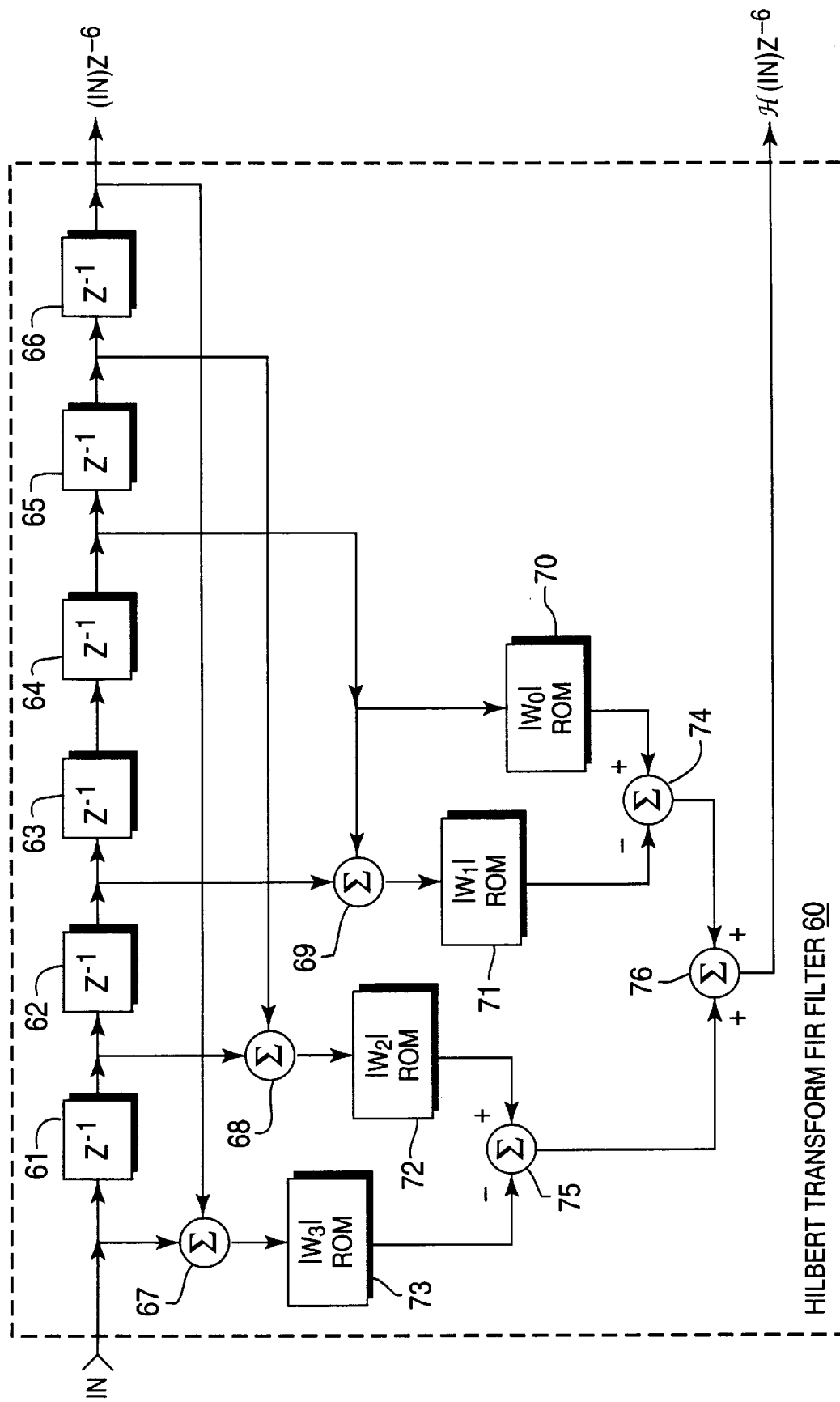
FIG. 6 is a detailed block schematic diagram of circuitry for converting digital samples to complex form in digital HDTV signal radio receivers embodying the invention, which circuitry includes a Hilbert transformation filter for generating imaginary samples from real samples, and which includes delay compensation for the real samples equivalent to the latency of that filter.

FIG. 6 shows a form that the circuitry 24 can take, which comprises:
(a) a linear-phase, finite-impulse-response (FIR) digital filter 60 that generates imaginary (Im) digital samples as a Hilbert transform response to the real (Re) digital samples; and
(b) compensating, clocked digital delay of the real digital samples to compensate for the latency time of the Hilbert transformation filter 60, which clocked digital delay can be provided by clocked latch elements 61–66 included in the Hilbert transformation filter 60.

The use of such circuitry for implementing in-phase and quadrature-phase sampling procedures on bandpass signals is described by D. W. Rice and K. H. Wu in their article "Quadrature Sampling with High Dynamic Range" on pp. 736–739 of IEEE TRANSACTIONS ON AEROSPACE AND ELECTRONIC SYSTEMS, Vol. AES-18, No. 4 (November 1982). Since the frequency band 6 MHz wide occupied by the final IF signal has a lowest frequency of at least a megaHertz or so, it is possible to use as few as seven non-zero-weighted taps in the FIR filter 60 used for Hilbert transformation.

The seven-tap Hilbert transformation filter 60 includes a cascade connection of one-sample delay elements 61, 62, 63, 64, 65 and 66 from which samples taken to be weighted and summed to generate the Hilbert transform response. The Hilbert transform is linear phase in nature so the tap weights of the FIR filter 60 exhibit symmetry about median delay. Accordingly, a digital adder 67 sums the input signal to delay element 61 and the output signal from the delay element 66 to be weighted in common, a digital adder 68 sums the output signal from the delay element 61 and the output signal from the delay element 65 to be weighted in common, and a digital adder 69 sums the output signal from the delay element 62 and the output signal from the delay element 64 to be weighted in common. The output signal from the delay element 64 is applied as input address to a read-only memory 70, which multiplies that signal by an appropriate weight $W_0$ magnitude. The sum output signal from the digital adder 69 is applied as input address to a read-only memory 71, which multiplies that signal by an appropriate weight $W_1$ magnitude. The sum output signal from the digital adder 68 is applied as input address to a read-only memory 72, which multiplies that signal by an appropriate weight $W_2$ magnitude. The sum output signal from the digital adder 67 is applied as input address to a read-only memory 73, which multiplies that signal by an appropriate weight $W_3$ magnitude. The use of the ROMs 70, 71, 72 and 73 as fixed-multiplicand multipliers keeps the delay associated with multiplication negligibly short. The output signals of the ROMs 70, 71, 72 and 73 are combined by a tree of signed digital adders 74, 75 and 76 operated as adders or subtractors, as required to appropriately assign signs to the magnitudes of the weights $W_0$, $W_1$, $W_2$ and $W_3$ stored in the ROMs 70, 71, 72 and 73. The adders 67, 68, 69, 74, 75 and 76 are assumed to be clocked adders each exhibiting one-sample latency, which results in the seven-tap FIR filter 60 exhibiting a six-sample latency. Delay of the filter 60 input signal that compensates for this latency is provided by the cascade connection of the six one-sample delay elements 61, 62, 63, 64, 65 and 66. The input address to the read-only memory 70 is taken from the output of the delay element 64, rather than from the output of the delay element 63, so the one-sample delay of delay element 64 compensates for the one-sample delays in the adders 67, 68 and 69.

C. M. Rader in his article "A Simple Method for Sampling In-Phase and Quadrature Components", IEEE TRANSACTIONS ON AEROSPACE AND ELECTRONIC SYSTEMS, Vol. AES-20, No. 6 (November 1984), pp. 821–824, describes improvements in complex synchronous detection carried out on digitized bandpass signals. Rader replaces the Hilbert-transform FIR filter and the compensating-delay FIR filter of Rice and Wu with a pair of all-pass digital filters designed based on Jacobian elliptic functions and exhibiting a constant $\pi/2$ difference in phase response for the digitized bandpass signals. A preferred pair of such all-pass digital filters has the following system functions:

$$H_1(z)=z^{-1}(z^{-2}-a^2)/(1-a^2z^{-2})\ \ a^2=0.5846832$$

$$H_2(z)=-(z^{-2}-b^2)/(1-b^2z^{-2})\ \ b^2=0.1380250$$

Rader describes filter configurations which require only two multiplications, one by $a^2$ and one by $b^2$.

Figure 7:
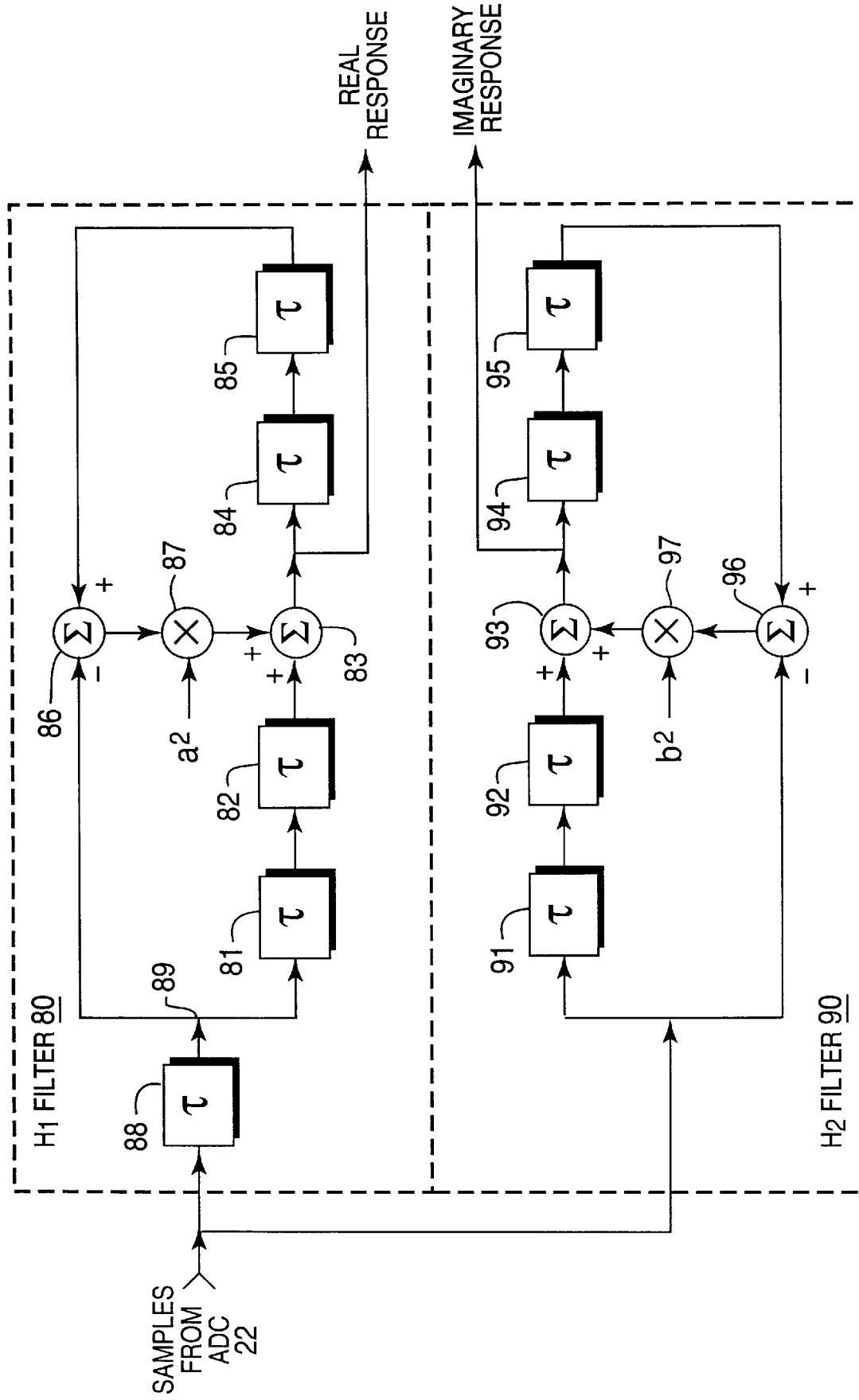
FIG. 7 is a detailed block schematic diagram of a pair of all-pass digital filters designed based on Jacobian elliptic functions and exhibiting a constant π/2 difference in phase response for the digitized bandpass signals, as can be employed for converting digital samples to complex form in digital HDTV signal radio receivers embodying the invention.

FIG. 7 shows an alternative form that the circuitry 24 can take, which comprises a pair of all-pass digital filters 80 and 90 of a type described by C. M. Rader and designed based on Jacobian elliptic functions. The filters 80 and 90 exhibit a constant $\pi/2$ difference in phase response for digitized bandpass signals. Since oversampled real samples better provide for symbol synchronization when synchrodyning VSB signals, the inventors prefer not to use the all-pass filters described by Rader that exploit sub-sampling to provide further reductions in the delay network circuitry.

The construction of the filter 80, which provides the system function $H_1(z)=z^{-1}$ $(z^{-2}-a^2)/(1-a^2z^{-2})$, where $a^2=0.5846832$ in decimal arithmetic, is shown in FIG. 7 to be as follows. The samples from the ADC 22 are delayed by one ADC sample clock duration in a clocked delay element 88 for application to a node 89. The signal at node 89 is further delayed by two ADC sample clock durations in cascaded clocked delay elements 81 and 82, for application as its first summand signal to a digital adder 83. The sum output signal of the adder 83 provides the real response from the filter 80. The sum output signal of the adder 83 is delayed by two ADC sample clock durations in cascaded clocked delay elements 84 and 85, for application as minuend input signal to a digital subtractor 86 that receives the signal at node 89 as its subtrahend input signal. The resulting difference output signal from the digital subtractor 86 is supplied as multiplier input signal to a digital multiplier 87 for multiplying an $a^2$ multiplicand signal, using a binary arithmetic. The resulting product output signal is applied to the digital adder 83 as its second summand signal.

The construction of the filter 90, which provides the system function $H_2(z)=-(z^{-2}-b^2)/(1-b^2z^{-2})$, where $b^2=0.1380250$ in decimal arithmetic, is shown in FIG. 7 to be as follows. The samples from the ADC 22 are delayed by two ADC sample clock durations in cascaded clocked delay elements 91 and 92, for application as first summand signal to a digital adder 93. The sum output signal of the adder 93 provides the imaginary response from the filter 90. The sum output signal of the adder 93 is delayed by two ADC sample clock durations in cascaded clocked delay elements 94 and 95, for application to a digital subtractor 96 as an applied minuend signal, which receives the samples from the ADC 22 as its subtrahend signal. The resulting difference output signal from the digital subtractor 96 is supplied as multiplier input signal to a digital multiplier 97 for multiplying a $b^2$ multiplicand signal, using a binary arithmetic. The resulting product output signal is applied to the digital adder 93 as its second summand signal.

Figure 8:
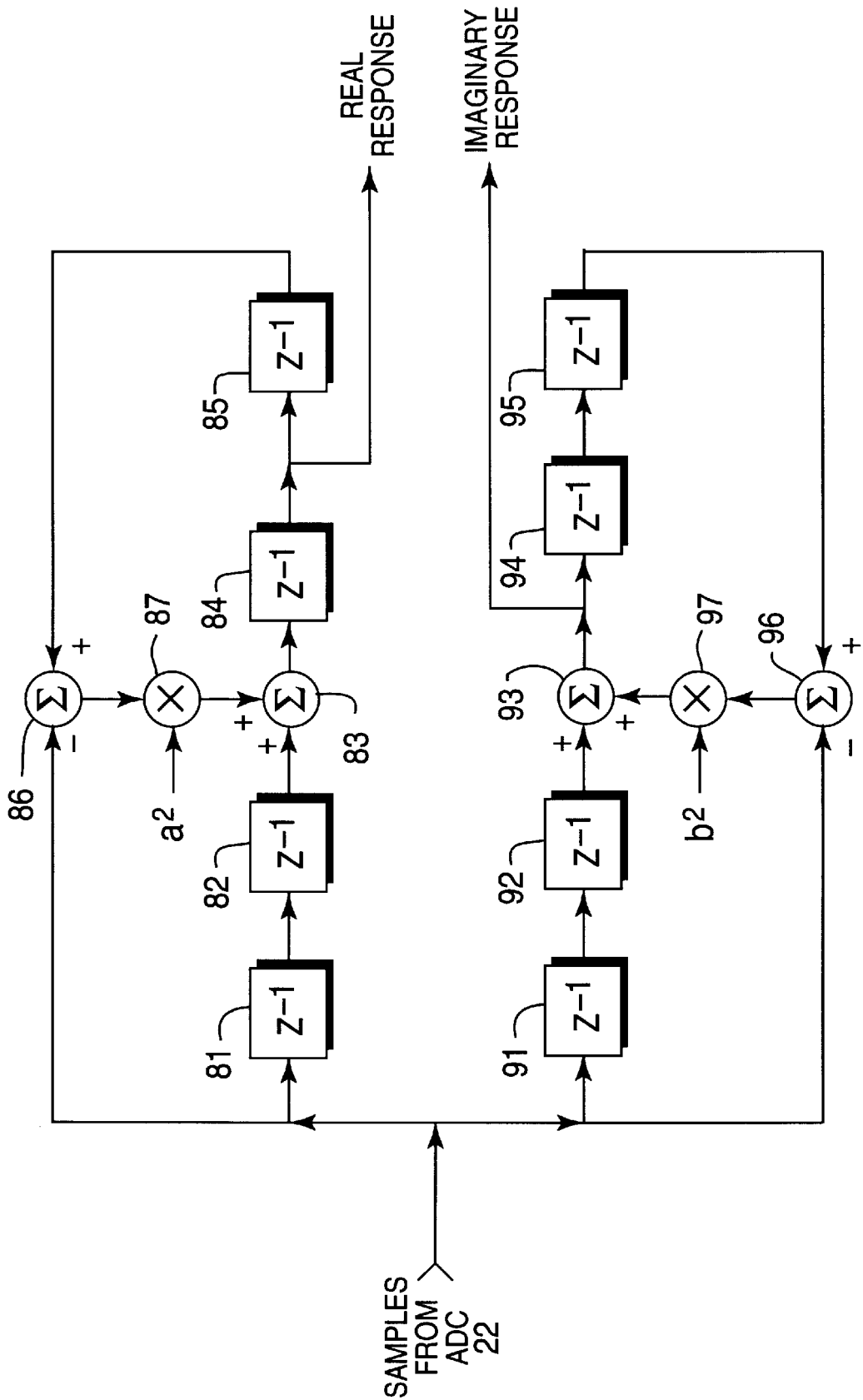
FIGS. 8 and 9 are block schematic diagrams of changes that can be made the filter circuitry of FIG. 7 to remove redundant delay.

FIG. 8 shows a complex-signal filter resulting from modifying the FIG. 7 complex-signal filter as follows. The position of the clocked delay element 88 is shifted so as to delay the sum output signal of the adder 83, rather than to delay the digital output signal of the ADC 22, and the digital output signal of the ADC 22 is applied to the node 89 without delay, thereby to cause real response to be provided at the output port of the shifted-in-position clocked delay element 88. The real response provided at the output port of the shifted-in-position clocked delay element 81 is the same as the response provided at the output port of the clocked delay element 84. So, the real response is provided from the output port of the clocked delay element 84 instead of from the output port of the shifted-in-position clocked delay element 81; and the shifted-in-position clocked delay element 81, being no longer required, is dispensed with.

Figure 9:
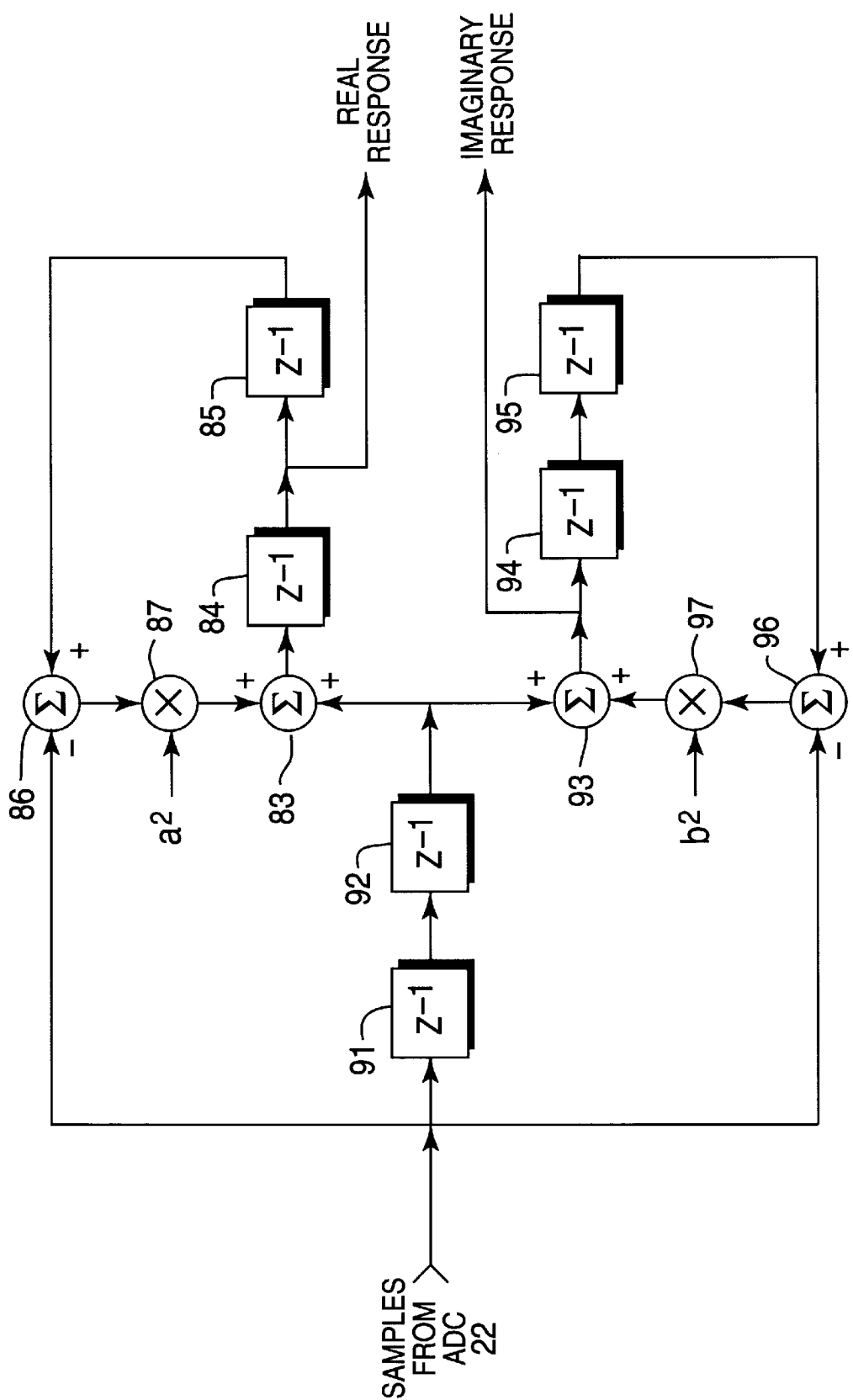

FIG. 9 shows a complex-signal filter resulting from modifying the FIG. 8 complex-signal filter as follows. The first summand signal for the adder 83 is then taken from the cascaded clocked delay elements 91 and 92, rather than from the cascaded clocked delay elements 81 and 82. The cascaded clocked delay elements 81 and 82, being no longer required, are dispensed with. The FIG. 9 complex-signal filter is preferred over the complex-signal filters of FIG. 7 and 8 in that redundant clocked delay elements are eliminated.

Figure 10:
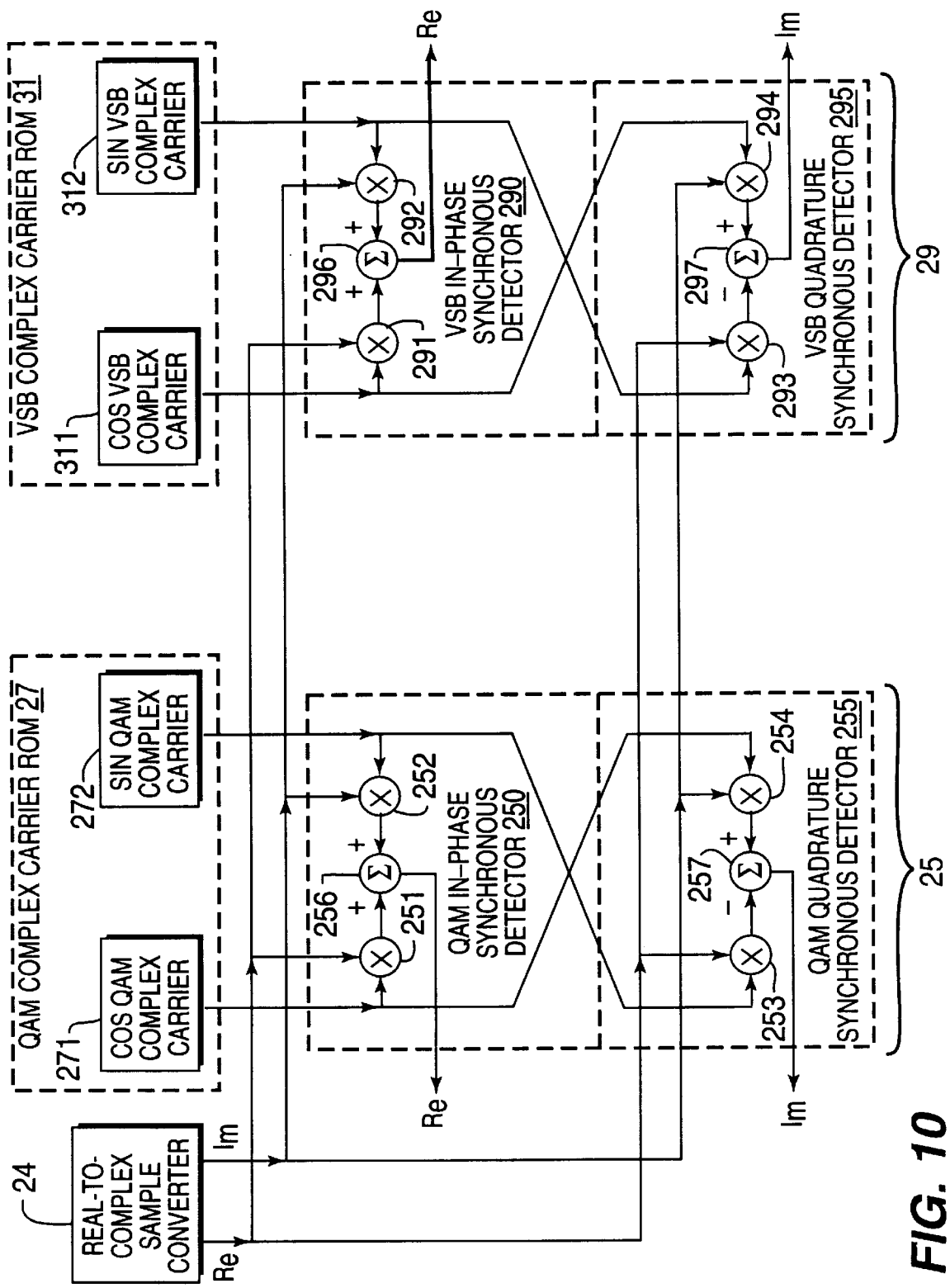
FIG. 10 is a detailed block schematic diagram of digital circuitry for synchrodyning QAM HDTV signals to baseband, of digital circuitry for synchrodyning VSB HDTV signals to baseband, and of circuitry associated with applying input signals to that QAM and VSB synchrodyning circuitry, as used in a digital HDTV signal radio receiver of the type shown in FIGS. 1 and 2.

FIG. 10 shows in more detail the digital circuitry 25 for synchrodyning QAM HDTV signals to baseband. The QAM synchrodyning circuitry 25 includes the QAM in-phase synchronous detector 250 for generating the real portion of its output signal and the QAM quadrature-phase synchronous detector 255 for generating the imaginary portion of its output signal. The QAM synchrodyning circuitry 25 includes a digital adder 256, a digital subtractor 257, and respective first, second, third and fourth digital multipliers 251–254. The QAM in-phase synchronous detector 250 includes the multiplier 251, the multiplier 252, and the adder 256 for adding the product output signals of the multipliers 251 and 252 to generate the real portion of the output signal of the QAM synchrodyning circuitry 25. The first digital multiplier 251 multiplies the real digital samples of final IF signal supplied from the real-to-complex-sample converter 24 by digital samples descriptive of the cosine of the QAM carrier that are read from the look-up table 271 in the ROM 27, and the second digital multiplier 252 multiplies the imaginary digital samples of final IF signal supplied from the real-to-complex-sample converter 24 by digital samples descriptive of the sine of the QAM carrier that are read from the look-up table 272 in the ROM 27. The QAM quadrature-phase synchronous detector 255 includes the multiplier 253, the multiplier 254, and the subtractor 257 for subtracting the product output signal of the multiplier 253 from the product output signal of the multiplier 254 to generate the imaginary portion of the output signal of the QAM synchrodyning circuitry 25. The third digital multiplier 253 multiplies the real digital samples of final IF signal supplied from the real-to-complex-sample converter 24 by digital samples descriptive of the sine of the QAM carrier that are read from the look-up table 272 in the ROM 27, and the fourth digital multiplier 254 multiplies the imaginary digital samples of final IF signal supplied from the real-to-complex-sample converter 24 by digital samples descriptive of the cosine of the QAM carrier that are read from the look-up table 271 in the ROM 27.

FIG. 10 also shows in more detail the digital circuitry 29 for synchrodyning VSB HDTV signals to baseband. The VSB synchrodyning circuitry 29 includes the VSB in-phase synchronous detector 290 for generating the real portion of its output signal and the VSB quadrature-phase synchronous detector 295 for generating the imaginary portion of its output signal. The VSB synchrodyning circuitry 29 includes a digital adder 296, a digital subtractor 297, and respective first, second, third and fourth digital multipliers 291–294. The VSB in-phase synchronous detector 290 includes the multiplier 291, the multiplier 292, and the adder 296 for adding the product output signals of the multipliers 291 and 292 to generate the real portion of the output signal of the VSB synchrodyning circuitry 29. The first digital multiplier 291 multiplies the real digital samples of final IF signal supplied from the real-to-complex-sample converter 24 by digital samples descriptive of the cosine of the VSB carrier that are read from the look-up table 291 in the ROM 29, and the second digital multiplier 292 multiplies the imaginary digital samples of final IF signal supplied from the real-to-complex-sample converter 24 by digital samples descriptive of the sine of the VSB carrier that are read from the look-up table 292 in the ROM 29. The VSB quadrature-phase synchronous detector 295 includes the multiplier 293, the multiplier 294, and the subtractor 297 for subtracting the product output signal of the multiplier 293 from the product output signal of the multiplier 294 to generate the imaginary portion of the output signal of the VSB synchrodyning circuitry 29. The third digital multiplier 293 multiplies the real digital samples of final IF signal supplied from the real-to-complex-sample converter 24 by digital samples descriptive of the sine of the VSB carrier that are read from the look-up table 292 in the ROM 29, and the fourth digital multiplier 294 multiplies the imaginary digital samples of final IF signal supplied from the real-to-complex-sample converter 24 by digital samples descriptive of the cosine of the VSB carrier that are read from the look-up table 291 in the ROM 29.

Figure 11:
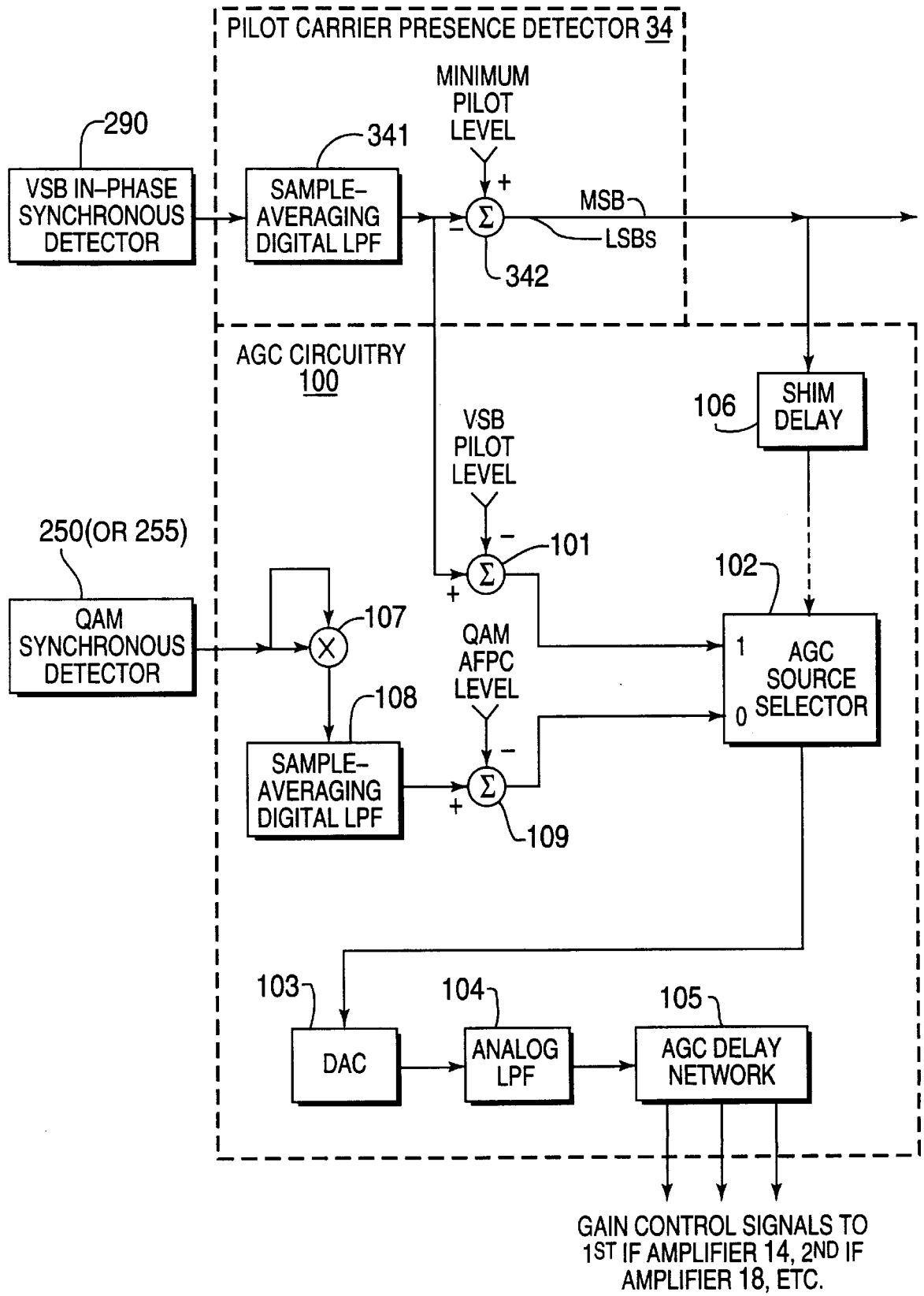
FIG. 11 is a detailed block schematic diagram of automatic gain control (AGC) circuitry and of a VSB pilot carrier presence detector, as used in a digital HDTV signal radio receiver of the type shown in FIGS. 1 and 2.

FIG. 11 shows in more detail one way to construct the VSB pilot carrier presence detector 34, which employs a digital lowpass filter 341 of a type that averages a sufficiently large number of samples supplied thereto from the VSB in-phase synchronous detector 290 to restrict the bandwidth of the filter 341 response, so that response is solely to the pilot carrier wave as synchrodyned to zero frequency. That is, the lowpass filter 341 does not exhibit substantial response to the higher frequencies to which the VSB signal synchrodynes. The response of the lowpass filter 341 is supplied as subtrahend signal to a digital subtractor 342. The subtractor 342 functions as a digital comparator to perform threshold detection. The subtractor 342 has applied thereto a wired minuend of about half the value to which the automatic gain control of the HDTV receiver regulates the pilot carrier wave, to provide a threshold level against which to detect the presence or absence of the pilot carrier wave. The most significant bit of the two's complement difference output signal of the subtractor 342 is a sign bit, which is a ONE to indicate the presence of the pilot carrier wave, and which is a ZERO to indicate the absence of the pilot carrier wave. This sign bit is the digital comparator output signal supplied as the output indication from the VSB pilot carrier presence detector 34.

An alternative way to construct the VSB pilot carrier presence detector 34 uses a digital-to-analog converter to convert samples supplied thereto from the VSB in-phase synchronous detector 290 to an analog input signal for an analog lowpass filter. The response of the analog lowpass filter is supplied to an analog comparator arranged to function as a threshold detector for determining the presence or absence of the pilot carrier wave. The digital construction of the VSB pilot carrier presence detector 34 shown in FIG. 11 is preferred in that the response of the digital lowpass filter 341 is also useful in implementing automatic gain control (AGC) circuitry in a digital HDTV signal radio receiver of the type shown in FIGS. 1 and 2.

FIG. 11 shows AGC circuitry 100 that uses the response of the digital lowpass filter 341 for developing AGC signals to control the conversion gain of the tuner 5 when the digital HDTV signal being currently received is of VSB type. The response of the filter 341 is supplied as minuend input signal to a digital subtractor 101, to have subtracted therefrom a wired subtrahend descriptive of the desired level of the digitized pilot carrier wave. The difference output from the subtractor 101, which is a digital AGC signal for VSB reception, is applied as a first input signal to a digital multiplexer 102. The digital multiplexer 102 selects the source of the digital AGC signal supplied to a digital-to-analog converter 103 for conversion to an analog AGC signal. The analog AGC signal is supplied to an analog lowpass filter 104 to be subjected to further lowpass filtering, and the lowpass response of the filter 104 is supplied to a delayed AGC network 105 of conventional design that responds to apply suitably delayed AGC signals to the first and second IF amplifiers 14 and 18 shown in FIG. 1, and in some designs to the first mixer 12 (or to a preceding radio-frequency amplifier not shown in FIG. 1) as well. The output indication from the VSB pilot carrier presence detector 34, as delayed a sample period or so of the multiplexer 102 input signals by a digital shim delay element 106, is the control signal applied to the multiplexer 102. When this signal is a ONE, indicative that an HDTV signal of VSB type is being received currently, the multiplexer 102 reproduces the difference output from the subtractor 101 to provide the filter 104 input signal.

The samples of output signal from either the QAM in-phase synchronous detector 250 or from the QAM quadrature-phase synchronous detector 255 are squared by a digital multiplier 107. A digital lowpass filter 108 of a type similar to the filter 341 receives as its input signal the product output signal from the digital multiplier 107. The response of the filter 108 is supplied as minuend input signal to a subtractor 109 to have subtracted therefrom a wired subtrahend descriptive of the desired mean square level of the QAM signal. The difference output from the subtractor 109, which is a digital AGC signal for QAM reception, is applied as a second input signal to the digital multiplexer 102. When the control signal applied to the multiplexer 102 is a ZERO, which is indirectly indicative that an HDTV signal of QAM type is being received currently, the multiplexer 102 reproduces the difference output from the subtractor 109 to provide the filter 104 input signal. The subtractor 109 will supply a digital AGC signal even during VSB reception, which signal suffices to provide a degree of AGC even when there is delay in the VSB pilot carrier presence detector 34 indicating that pilot carrier is present, so VSB reception is enabled.

The DAC 103 is preferably of a special design, which supplies a predetermined direct level of analog AGC signal for all negative digital input signals and responds with varying level only to positive digital input signals. Since the AGC signal is of such narrow bandwidth, it is unnecessary to supply it to the DAC 103 at first clock rates. Indeed, to conserve operating energy, etc., it is desirable to operate the DAC 103 at much lower rates.

Figure 12:
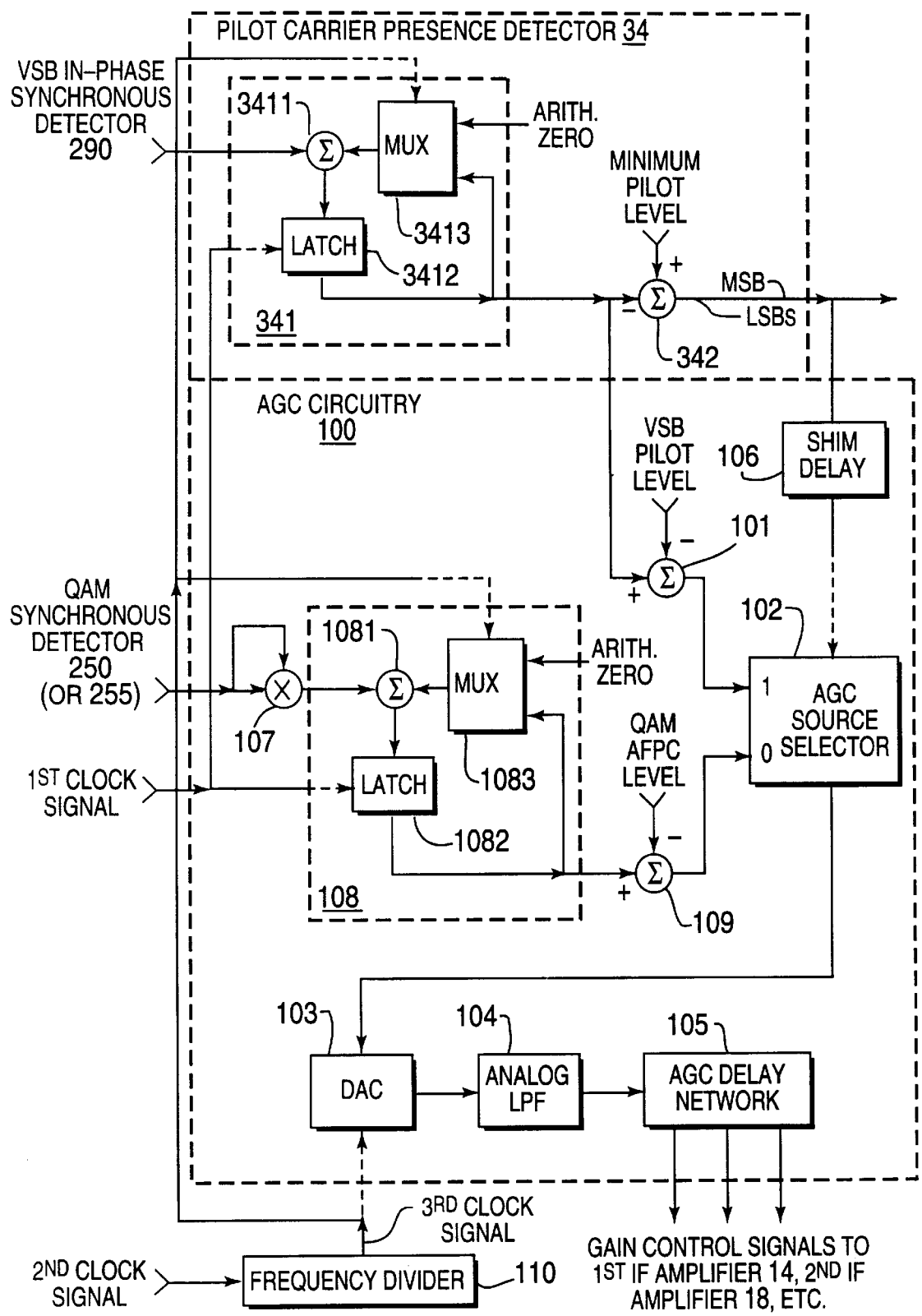
FIG. 12 is a detailed block schematic diagram of the preferred construction of portions of the FIG. 11 AGC circuitry in which digital lowpass filtering and digital-to-analog conversion are performed.

FIG. 12 shows in more detail the preferred construction of portions of the FIG. 11 circuitry in which digital lowpass filtering and digital-to-analog conversion are performed. A frequency divider 110 generates a third clock signal at a rate that is a large submultiple (e.g., $2^{10}$) of the second clock signal. For example, the frequency divider 110 comprises:

(a) a chain of binary counter stages that generates an overflow pulse whenever its final stage is toggled, and (b) pulse shaping circuitry for shaping the overflow pulses into respective clocking pulses for the third clock signal.

This third clock signal clocks an input latch 1031 of the DAC 103 and an input latch 1061 in the digital shim delay element 106. The digital lowpass filter 108 is realized as an accumulator comprising a digital adder 1081; an output latch 1082 for the adder 1081, clocked by said first clock signal; and a digital multiplexer 1083 conditioned by the third clock signal to reset the accumulation. The digital lowpass filter 341 is also realized as an accumulator comprising a digital adder 3411; an output latch 3412 for the adder 3411, clocked by said first clock signal; and a digital multiplexer 3413 conditioned by the third clock signal to reset the accumulation.

Variants of the VSB synchrodyne circuitry 29 in which the digitized final IF signal is narrowband bandpass filtered prior to VSB quadrature-phase synchronous detection are possible in less preferred embodiments of the invention described in this specification and claimed in the ensuing claims; some of these variants also require modification of the ROM circuitry 31 used for generating digital complex-number descriptions of the VSB signal carrier as translated to final intermediate frequency. Such variants are described in more detail in the inventors' previous patent applications incorporated herein by reference.

Embodiments of the invention are contemplated which do not use the pilot carrier presence detector 34 to determine whether the HDTV signal being currently received is of QAM or VSB type. For example, the imaginary samples from the VSB quadrature-phase synchronous detector 295 are squared, the squared samples are lowpass filtered, and the lowpass filter response is threshold detected. If the HDTV signal being currently received is of VSB type, the imaginary samples from the VSB quadrature-phase synchronous detector 295 are substantially zero-valued, the squared samples are substantially zero-valued, and the lowpass filter response is substantially zero-valued, so it does not exceed the threshold level of the threshold detector. If the HDTV signal being currently received is of QAM type, the imaginary samples from the VSB quadrature-phase synchronous detector 295 have at least at times values other than zero, and the lowpass filter response to the squared imaginary samples contains a direct term that exceeds the threshold level of the threshold detector. The preference of the inventors for the pilot carrier presence detector 34 is because of its also being useful in the AGC circuitry for controlling the conversion gain of the tuner 5.

Less preferred embodiments of the invention are contemplated in which the output signals of the two-dimensional trellis decoder 37 and of the one-dimensional trellis decoder 38 are supplied to respective data de-interleavers, with data source selection being deferred until data de-interleaving is completed. Other less preferred embodiments of the invention are contemplated in which embodiments the output signal of the two-dimensional trellis decoder 37 is de-interleaved by a respective data de-interleaver and then decoded by a respective Reed-Solomon decoder to generate a first stream of error-corrected data, in which embodiments the output signal of the one-dimensional trellis decoder 38 is de-interleaved by a respective data de-interleaver and then decoded by a respective Reed-Solomon decoder to generate a second stream of error-corrected data, and in which embodiments data source selection is made between the first and second streams of error-corrected data. In modifications of these other less preferred embodiments of the invention the first and second streams of error-corrected data are supplied to separate data de-randomizers before data source selection is made. In other variants separate Reed-Solomon decoders are used for the QAM and VSB signals, but one data de-interleaver is used for both the QAM and VSB signals, or one data de-randomizer is used for both the first and second streams of error-corrected data.

In the claims which follow, the word "said" is used whenever reference is made to an antecedent, and the word "the" is used for grammatical purposes other than to refer back to an antecedent.

What is claimed is:

1. A radio receiver for receiving a selected digital HDTV signal, irrespective of whether it is a quadrature-amplitude-modulation (QAM) or a vestigial-sideband (VSB) signal, comprising:

a tuner for selecting said selected digital HDTV signal, irrespective of whether it is a quadrature-amplitude-modulation (QAM) or a vestigial sideband (VSB) signal, and converting it to a final intermediate-frequency (IF) signal;

an analog-to-digital converter for digitizing said final IF signal to generate a digitized final IF signal;

QAM synchrodyning circuitry for generating real and imaginary sample streams of interleaved QAM symbol code, by synchrodyning said digitized final IF signal to baseband providing it is a QAM signal and otherwise processing said digitized final IF signal as if it were a QAM signal to be synchrodyned to baseband; and VSB synchrodyning circuitry for generating a real sample stream of interleaved VSB symbol code, by synchrodyning said digitized final IF signal to baseband providing it is a VSB signal and otherwise processing said digitized final IF signal as if it were a VSB signal to be synchrodyned to baseband.

2. A radio receiver as set forth in claim 1, further comprising:

means for detecting whether said final IF signal is a QAM signal or a VSB signal to generate a control signal, said control signal being in a first condition when said final IF signal is a QAM signal and being in a second condition when said final IF signal is a VSB signal;

means responding to said control signal being in a first condition for automatically switching the radio receiver to operate in a QAM signal reception mode; and means responding to said control signal being in a second condition for automatically switching the radio receiver to operate in a VSB signal reception mode.

3. A radio receiver as set forth in claim 2 wherein said means for detecting whether said final IF signal is a QAM signal or a VSB signal comprises:

a pilot carrier presence detector for generating said control signal, said pilot carrier presence detector generating said first condition of said control signal when detecting the presence of a pilot carrier of substantial energy and otherwise generating said second condition of said control signal.

4. A radio receiver as set forth in claim 3, wherein said tuner includes first and second intermediate-frequency amplifiers, said radio receiver further comprising:

a digital-to-analog converter for converting to an analog output signal therefrom, a digital input signal supplied thereto;

means for controlling the gains of said first and second intermediate-frequency amplifiers in accordance with said analog output signal from said digital-to-analog converter;

means for squaring each of the samples in one of real and imaginary sample streams of interleaved QAM symbol code;

a first lowpass digital filter for obtaining the mean average of the resulting squared samples;

means for determining the departure from a first prescribed value, of said mean average of said resulting squared samples, thereby to generate a first digital AGC signal;

a second lowpass digital filter for obtaining the mean average of the samples in said real sample stream of interleaved VSB symbol code, said second lowpass digital filter being included in said pilot carrier presence detector;

means for determining the departure from a second prescribed value, of said mean average of said samples in said real sample stream of interleaved VSB symbol code, thereby to generate a second digital AGC signal;

a multiplexer, said multiplexer responding to indications generated by said pilot carrier presence detector that said selected HDTV signal is of QAM type for selecting said first digital AGC signal as the digital input signal supplied to said digital-to-analog converter, said multiplexer responding to indications generated by said pilot carrier presence detector that said selected HDTV signal is of VSB type for selecting said second digital AGC signal as the digital input signal supplied to said digital-to-analog converter; and means, included in said pilot carrier presence detector, for determining the departure from a third prescribed value, of said mean average of said samples in said real sample stream of interleaved VSB symbol code, the polarity of said departure from a third prescribed value indicating whether said pilot carrier presence detector indicates the presence or absence of pilot carrier accompanying said selected HDTV signal.

5. A radio receiver as set forth in claim 1, wherein said tuner includes first and second intermediate-frequency amplifiers, said radio receiver further comprising:

a digital-to-analog converter for converting to an analog output signal therefrom, a digital input signal supplied thereto;

means for controlling the gains of said first and second intermediate-frequency amplifiers in accordance with said analog output signal from said digital-to-analog converter;

means for squaring each of the samples in one of real and imaginary sample streams of interleaved QAM symbol code;

a first lowpass digital filter for obtaining the mean average of the resulting squared samples;

means for determining the departure from a first prescribed value, of said mean average of said resulting squared samples, thereby to generate a first digital AGC signal;

a second lowpass digital filter for obtaining the mean average of the samples in said real sample stream of interleaved VSB symbol code;

means for determining the departure from a second prescribed value, of said mean average of said samples in said real sample stream of interleaved VSB symbol code, thereby to generate a second digital AGC signal; and a multiplexer, said multiplexer responding to said control signal being in a first condition for selecting said first digital AGC signal as the digital input signal supplied to said digital-to-analog converter, said multiplexer responding to said control signal being in a second condition for selecting said second digital AGC signal as the digital input signal supplied to said digital-to-analog converter.

6. A radio receiver as set forth in claim 1, further comprising:
- QAM symbol de-interleaving means responsive to said real and imaginary sample streams of interleaved QAM symbol code for generating real and imaginary sample streams of de-interleaved QAM symbol code;
- VSB symbol de-interleaving means responsive to said real sample stream of interleaved VSB symbol code for generating a real sample stream of de-interleaved VSB symbol code;
- means for detecting whether said final IF signal is a QAM signal or a VSB signal to generate a control signal, said control signal being in a first condition when said final IF signal is a QAM signal and being in a second condition when said final IF signal is a VSB signal;
- an amplitude-and-group-delay equalizer having real-sample and imaginary-sample input terminals, real-sample and imaginary-sample output terminals, a programmable digital filter for processing digital signal received at the input terminals of said equalizer to supply amplitude-equalized response at the real-sample and imaginary-sample output terminals of said equalizer, and computing elements for programming said digital filter in accordance with said control signal and with selected portions of the digital signal received at the input terminals of said equalizer; and
- a synchrodyne result selector, responsive to the first condition of said control signal for selecting said real sample stream of de-interleaved QAM symbol code for application to the real-sample input terminal of said equalizer, further responsive to the first condition of said control signal for selecting said imaginary sample stream of de-interleaved QAM symbol code for application to the imaginary-sample input terminal of said equalizer, responsive to the second condition of said control signal for selecting said real sample stream of de-interleaved VSB symbol code for application to the real-sample input terminal of said equalizer, and further responsive to the second condition of said control signal for selecting arithmetic zero to the imaginary-sample input terminal of said equalizer.

7. A radio receiver as set forth in claim 6, wherein said means for detecting whether said final IF signal is a QAM signal or a VSB signal comprises:
- a pilot carrier presence detector detecting the presence or absence of a pilot carrier accompanying said selected HDTV signal for generating said control signal.

8. A radio receiver as set forth in claim 6, wherein said VSB symbol de-interleaving means comprises, at least at selected times, an NTSC-rejection filter.

9. A radio receiver as set forth in claim 6, including 2:1 decimation circuitry, for decimating 2:1 said samples applied to the real-sample input terminal of said equalizer, and for decimating 2:1 said samples applied to the imaginary-sample input terminal of said equalizer.

10. A radio receiver as set forth in claim 1, further comprising:
- QAM symbol de-interleaving means responsive to said real and imaginary sample streams of interleaved QAM symbol code for generating real and imaginary sample streams of de-interleaved QAM symbol code;
- an NTSC-rejection filter responsive to said real sample stream of interleaved VSB symbol code for generating an NTSC-rejection filter response;
- means for detecting whether said final IF signal is a QAM signal or a VSB signal to generate a control signal, said control signal being in a first condition when said final IF signal is a QAM signal and being in a second condition when said final IF signal is a VSB signal;
- an amplitude-and-group-delay equalizer having real-sample and imaginary-sample input terminals, real-sample and imaginary-sample output terminals, a programmable digital filter for processing digital signal received at the input terminals of said equalizer to supply amplitude-equalized response at the real-sample and imaginary-sample output terminals of said equalizer, and computing elements for programming said digital filter in accordance with said control signal and with selected portions of the digital signal received at the input terminals of said equalizer; and
- a synchrodyne result selector, responsive to the first condition of said control signal for selecting said real sample stream of de-interleaved QAM symbol code for application to the real-sample input terminal of said equalizer, further responsive to the first condition of said control signal for selecting said imaginary sample stream of de-interleaved QAM symbol code for application to the imaginary-sample input terminal of said equalizer, responsive to the second condition of said control signal for selecting said for application to the real-sample input terminal of said equalizer, and further responsive to the second condition of said control signal for selecting arithmetic zero to the imaginary-sample input terminal of said equalizer.

11. A radio receiver as set forth in claim 10, wherein said means for detecting whether said final IF signal is a QAM signal or a VSB signal comprises:
- a pilot carrier presence detector detecting the presence or absence of a pilot carrier accompanying said selected HDTV signal for generating said control signal.

12. A radio receiver as set forth in claim 10, including 2:1 decimation circuitry, for subsampling 2:1 said samples applied to the real-sample input terminal of said equalizer, and for subsampling 2:1 said samples applied to the imaginary-sample input terminal of said equalizer.

13. A radio receiver as set forth in claim 10, further comprising:
- a two-dimensional trellis decoder for performing symbol decoding that recovers a digital data stream from the amplitude-equalized response of said equalizer when said final IF signal is a QAM signal;
- first data synchronization recovery circuitry for recovering first data synchronizing information included in the digital data stream from the two-dimensional trellis decoder;
- a one-dimensional trellis decoder for performing symbol decoding that recovers a digital data stream from the amplitude-equalized response of said equalizer when said final IF signal is a VSB signal;
- second data synchronization recovery circuitry for recovering second data synchronizing information included in the digital data stream from the one-dimensional trellis decoder;
- a data source selector, responsive to the first condition of said control signal for selecting as its output signal the digital data stream from said two-dimensional trellis decoder, and responsive to the second condition of said control signal for selecting as its output signal the digital data stream from said one-dimensional trellis decoder; and
- a data sync selector, responsive to the first condition of said control signal for selecting as its output signal said first data synchronizing information, and responsive to the second condition of said control signal for selecting as its output signal said second data synchronizing information.

14. A radio receiver as set forth in claim 13, further comprising:
a data de-interleaver receiving the output signals of said data source selector and said data sync selector as input signals thereto, said data de-interleaver de-interleaving the output signal of said data source selector in one of two patterns, as selected by said control signal, for supplying de-interleaved data as its output signal.

15. A radio receiver as set forth in claim 14, further comprising:
a Reed-Solomon decoder receiving the output signals of said data de-interleaver and said data sync selector as input signals thereto, said Reed-Solomon decoder decoding the output signal of said data de-interleaver in accordance with one of two Reed-Solomon decoding algorithms, as selected by said control signal, for supplying error-corrected data as its output signal.

16. A radio receiver as set forth in claim 15, further comprising:
a data de-randomizer, connected for receiving said error-corrected data from said Reed-Solomon decoder and said data sync selector as input signals thereto, and connected for supplying de-randomized error-corrected data as an output signal therefrom.

17. A radio receiver as set forth in claim 16, for receiving a selected digital HDTV signal of a type causing said de-randomized error-corrected data to be arranged in packets, said radio receiver further comprising:
a digital sound decoder;
an MPEG video decoder; and
a packet sorter receiving as its input signal the output signal of said data de-randomizer and sorting said packets of said de-randomized error-corrected data therein, for applying certain ones of said packets to said digital sound decoder as input signal thereto, and for applying certain ones of said packets to said MPEG video decoder as input signal thereto.

18. A radio receiver as set forth in claim 1, wherein said final IF signal resides in a frequency band the lowest frequency of which is not appreciably more than 2.38 MHz, which frequency band is substantially 6 MHz wide.

19. A radio receiver for receiving a selected one of high-definition television (HDTV) signals each including symbol codes descriptive of digital signals, irrespective of whether said selected HDTV signal is a quadrature-amplitude-modulation (QAM) signal or is a vestigial-sideband (VSB) signal including a pilot carrier having an amplitude related to signal levels in said symbol codes thereof, said radio receiver comprising:
a tuner, including
means for selecting one of channels at different locations in a frequency band used for transmitting HDTV signals, including
a succession of mixers for performing a plural conversion of signal received in the selected channel to a final intermediate-frequency (IF) signal, including
a respective frequency-selective amplifier between each earlier one of said mixers in said succession and each next one of said mixers in said succession, and including
respective local oscillators for supplying oscillations of different frequencies to each of said mixers, each of said local oscillators supplying respective oscillations of substantially the same frequency irrespective of whether the selected HDTV signal is a QAM signal or is a VSB signal;
a sample clock generator for generating a sample clock signal comprising recurrent pulses supplied at a rate controlled to be a multiple of the symbol frequency of said selected HDTV signal;
an analog-to-digital converter responsive to said sample clock signal for recurrently sampling a lowpass response to the signal from the final mixer in said succession of mixers included in said tuner, and for digitizing the resulting samples to generate a digitized final intermediate frequency signal;
means for modularly counting said recurrent pulses to generate a first address count;
means combining a first symbol phase correction with said first address count for generating first read-only memory addressing;
first read-only memory addressed by said first read-only memory addressing for generating digital descriptions of in-phase and quadrature-phase GAM signal carriers;
means for modularly counting said recurrent pulses to generate a second address count;
means combining a second symbol phase correction with said second address count for generating second read-only memory addressing;
second read-only memory addressed by said second read-only memory addressing for generating digital descriptions of in-phase and quadrature-phase VSB signal carriers;
first and second synchrodyning means each using said digital descriptions of in-phase and quadrature-phase QAM signal carriers for generating first and second synchrodyning results, respectively, in which said first and second synchrodyning results real and in-phase components of said digitized final intermediate frequency signal are respectively synchrodyned each to baseband whenever said selected HDTV signal is a QAM signal;
a first symbol decoder for decoding said symbol codes, as encoded in said first and second synchrodyning results whenever said selected HDTV signal is a QAM signal, for generating a first data stream;
a first phase correction generator for generating said first symbol phase correction responsive to said first and second synchrodyning results;
third synchrodyning means using said digital descriptions of in-phase and quadrature-phase VSB signal carriers for generating a third synchrodyning result, in which said third synchrodyning result a real component of said digitized final intermediate frequency signal is synchrodyned to baseband whenever said selected HDTV signal is a VSB signal;
a second symbol decoder for decoding said symbol codes, as encoded in said third synchrodyning result whenever said selected HDTV signal is a VSB signal, for generating a second data stream;
a second phase correction generator for generating said second symbol phase correction responsive to said third synchrodyning result;
means for detecting whether said final IF signal is a CAM signal or a VSB signal to generate a control signal, said control signal being in a first condition when said final IF signal is a QAM signal and being in a second condition when said final IF signal is a VSB signal;

means responding to said control signal being in a first condition for automatically switching the radio receiver to operate in a QAM signal reception mode; and means responding to said control signal being in a second condition for automatically switching the radio receiver to operate in a VSB signal reception mode.

20. A radio receiver as set forth in claim 19, wherein said means for detecting whether said final IF signal is a QAM signal or a VSB signal comprises:

a pilot carrier presence detector detecting the presence or absence of a pilot carrier accompanying said selected HDTV signal for generating said control signal.

21. A radio receiver as set forth in claim 19, further comprising:

a generator of first automatic frequency control signal, which first frequency control signal is generated in response to said first and second synchrodyning results;

means for selectively applying said first automatic frequency control signal to an automatic-frequency-controlled one of said local oscillators in said tuner whenever said control signal is in its said first condition, thereby regulating the frequency of the signal from said final mixer so said first and second synchrodyning results are at baseband, which means for selectively applying said first automatic frequency control signal is included in said means responding to said control signal being in a first condition for automatically switching the radio receiver to operate in a QAM signal reception mode;

fourth synchrodyning means using said digital descriptions of in-phase and quadrature-phase VSB signal carriers for generating a fourth synchrodyning result, in which said fourth synchrodyning result an imaginary component of said digitized final intermediate frequency signal is synchrodyned to baseband whenever said selected HDTV signal is a VSB signal;

a generator of second automatic frequency control signal, which second frequency control signal is generated in response to said fourth synchrodyning result; and means for selectively applying said second automatic frequency control signal to said automatic-frequency-controlled one of said local oscillators in said tuner whenever said control signal is in its said second condition, thereby regulating the frequency of the signal from said final mixer so said third and fourth synchrodyning results are at baseband, which means for selectively applying said second automatic frequency control signal is included in said means responding to said control signal being in a second condition for automatically switching the radio receiver to operate in a VSB signal reception mode.

22. A radio receiver for receiving a selected one of high-definition television (HDTV) signals each including symbol codes descriptive of digital signals, irrespective of whether said selected HDTV signal is a quadrature-amplitude-modulation (QAM) signal or is a vestigial-sideband (VSB) signal including a pilot carrier having an amplitude related to signal levels in said symbol codes thereof, said radio receiver comprising:

a pilot carrier presence detector detecting the presence or absence of a pilot carrier accompanying said selected HDTV signal for generating indications of whether said selected HDTV signal is of VSB or QAM type;

means responding to indications generated by said pilot carrier presence detector that said selected HDTV signal is of VSB type for automatically switching the radio receiver for operation in a VSB signal reception mode; and means responding to indications generated by said pilot carrier presence detector that said selected HDTV signal is of QAM type for automatically switching the radio receiver for operation in a QAM signal reception mode.

* * * * *